(12) United States Patent
Kang et al.

(10) Patent No.: US 7,391,649 B2
(45) Date of Patent: Jun. 24, 2008

(54) PAGE BUFFER AND NON-VOLATILE MEMORY DEVICE INCLUDING THE SAME

(75) Inventors: Joo-Ah Kang, Seoul (KR); Jong-Hwa Kim, Hwaseong-si (KR); Moo-Sung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 11/416,320

(22) Filed: May 3, 2006

(65) Prior Publication Data

US 2007/0002631 A1    Jan. 4, 2007

(30) Foreign Application Priority Data

Jul. 4, 2005    (KR) ............... 10-2005-0059779

(51) Int. Cl.
    *G11C 11/34* (2006.01)
(52) U.S. Cl. ............ 365/185.21; 365/205; 365/185.2; 365/189.09; 365/189.05
(58) Field of Classification Search ............ 365/185.21, 365/205, 185.2, 189.09, 189.05
    See application file for complete search history.

(56) References Cited

U.S. PATENT DOCUMENTS

| | | | | |
|---|---|---|---|---|
| 6,671,204 B2 * | 12/2003 | Im | ............... | 365/185.12 |
| 6,807,096 B2 | 10/2004 | Toda | | |
| 6,813,184 B2 * | 11/2004 | Lee | ............... | 365/185.09 |
| 6,937,510 B2 * | 8/2005 | Hosono et al. | ......... | 365/185.03 |
| 6,996,014 B2 * | 2/2006 | Lee et al. | ............... | 365/189.05 |
| 7,149,130 B2 * | 12/2006 | Lee | ............... | 365/189.05 |
| 7,180,784 B2 * | 2/2007 | Ju | ............... | 365/185.22 |
| 7,193,911 B2 * | 3/2007 | Kim | ............... | 365/194 |
| 7,236,397 B2 * | 6/2007 | Kim | ............... | 365/185.09 |
| 2002/0126531 A1 | 9/2002 | Hosono et al. | | |

FOREIGN PATENT DOCUMENTS

| | | |
|---|---|---|
| JP | 2001-325796 | 11/2001 |
| JP | 2004-206833 | 7/2004 |
| JP | 02006252748 A * | 9/2006 |
| KR | 1020010077273 A | 8/2001 |
| KR | 1020010100809 A | 11/2001 |
| KR | 1020040057972 A | 7/2004 |

* cited by examiner

*Primary Examiner*—Viet Q Nguyen
(74) *Attorney, Agent, or Firm*—Volentine & Whitt, PLLC

(57) ABSTRACT

In one aspect, a non-volatile memory device includes a non-volatile memory cell array and a page buffer. The page buffer includes a sense node selectively connected to a bit line of the memory cell array, a main latch circuit including first and second main latch nodes, where the first main latch node is selectively connected to the sense node, and a latch input node selectively connected to the first and second main latch nodes. The page buffer further includes a cache latch circuit including first and second cache latch nodes, a switching circuit which selectively connects the second cache latch node to the latch input node, and a shared sense circuit connected between to the latch input node and a reference potential. The shared sense circuit selectively connects the latch input node to the reference potential in response to a voltage of the sense node and a voltage of the first cache latch node.

35 Claims, 32 Drawing Sheets

PAGE BUFFER AND NON-VOLATILE MEMORY DEVICE INCLUDING THE SAME

BACKGROUND OF THE INVENTION

1. The present invention generally relates to semiconductor memory devices, and more particularly, the present invention relates to nonvolatile semiconductor memory devices and to methods of operating nonvolatile memory devices.

2. Description of the Related Art

The demand for electrically programmable and electrically erasable nonvolatile memory devices has increased dramatically in recent years. Such devices are at least partially characterized by the ability to maintain stored data even in the absence of supplied power. The use of so-called flash memories has become especially popular, particularly, but not exclusively, in the context of portable devices such as digital cameras, cell phones, personal data assistants (PDAs), and laptop computers. Flash memories, such as NAND-type flash memories, are capable of storing large amounts of data in a relatively small area.

As background discussion, the basic operating principles underlying flash memory cells and flash memory devices are presented below. However, it should be clearly understood that the discussion that follows is merely exemplary and does not in any way limit and/or define the scope of the present invention.

The operating principle of a flash memory cell will be described first with reference to FIGS. 1A through 1C. FIG. 1A illustrates a typical configuration in which a flash memory cell transistor is connected to word and bit lines of a memory device, FIG. 1B shows the circuit symbol of a flash memory cell transistor, and FIG. 1C shows the threshold voltage characteristics of a flash memory cell transistor.

Referring collectively to FIGS. 1A through 1C, a flash memory cell transistor includes a source region 4 and a drain region 5 located at the surface of a substrate 3. In this example, the substrate is P-type, and the source and drain regions 4 and 5 are $N^+$-type. A gate structure is aligned over a channel region defined between the source and drain regions 4 and 5. The gate structure includes a floating gate 1 and a control gate 2. Although not shown, a tunneling dielectric layer is interposed between the floating gate 1 and the surface of the substrate P-sub, and another thin oxide layer (or control dielectric) is interposed between the floating gate 1 and the control gate 2. In the illustrated example, the drain voltage Vd is supplied from a bit line BL, the control gate voltage Vcg is supplied from a word line WL, and the source voltage Vs is connected to a reference potential such as ground.

The threshold voltage (or voltages) of the flash memory cell transistor defines its stored logic value. That is, in the example of a single-level cell (SLC) transistor, when the flash memory cell transistor is in its initial state (also called an "erased" state), the threshold voltage Vth is relatively low as shown in FIG. 1C. In this state, the cell transistor is designated to have a logic value "1", which generally corresponds to the ON state of a conventional transistor device. On the other hand, when the cell transistor is in its "programmed" state (PGM), the threshold voltage Vth is relatively high. This high threshold voltage state is designated to have a logic value "0", which generally corresponds to the OFF state of a conventional transistor device.

In order to change (program) the cell transistor from its initial state to its programmed state, a process known as Fowler-Nordheim (FN) tunneling is utilized. Briefly, a relatively large positive potential difference is created between the control gate 2 and the substrate P-sub, and excited electrons within the channel on the surface of the substrate are caused to be pushed through and trapped in the floating gate 1. These negatively charged electrons act as a barrier between the control gate 2 and channel on the substrate, thus increasing the threshold voltage of the cell transistor as represented in FIG. 1C. The cell transistor can be brought back to its initial state by forming a large negative potential difference between the control gate 2 and the substrate P-sub, whereby resultant FN tunneling draws the trapped electrons back across the thin oxide layer between the floating gate 1 and substrate, thus removing the electron barrier and decreasing the threshold voltage Vth.

Multi-level cell (MLC) nonvolatile memories are characterized by utilizing each cell transistor to store two or more bits of data simultaneously. FIG. 2 is a diagram for explaining the operation of an exemplary two-bit nonvolatile cell memory. The threshold voltages Vth of the large numbers of flash cell transistors found in flash memory devices generally exhibit bell curve distributions. In the example of FIG. 2, the cell transistor can be set in any one of four (4) different threshold distributions, i.e., a first state, a second state, a third state and a fourth state. Any cell transistor having a threshold voltage within the distribution defined by one of these four states is assigned a corresponding two-bit logic value, for example, "11", "10", "00" and "01" as shown in FIG. 2. The particular bit assignments illustrated in FIG. 2 are known in the art as "gray-coding."

As mentioned above, a cell transistor is said to be "programmed" when its threshold voltage is increased from its normally ON state (its erased state) to a threshold voltage of a higher state. In FIG. 2, the threshold voltage distribution to the far left of the diagram ("11") is the erased state. In two-bit programming of the cell transistor, two successive programming operations are executed, namely, a least significant bit (LSB) program mode, and a most significant bit (MSB) program mode.

Examples of these LSB and MSB program modes are described below with reference to FIGS. 3-5.

Note first that the cell transistor is initially in its erased state, and accordingly, its initial logic value is "11" (FIG. 2). In this example, if the LSB of the data to be stored is "0", then a programming operation is executed to increase the threshold voltage of the cell transistor from the first state to the second state (FIG. 3). On the other hand, if the LSB of the data to be stored is "1", no programming is executed during the LSB program mode. Note here that the cell transistor is either in the first state or the second state after the LSB program mode.

Next the MSB of the data to be stored dictates operations in the MSB program mode. FIG. 4 illustrates the case where gray-coding has been adopted. Regardless of whether the cell transistor is in the first state or the second state after the LSB program mode, no programming is executed in the MSB program mode if the MSB of the data to be stored is "1". On the other hand, if the MSB of the data to be stored is "0", then programming occurs which is dependent on whether the cell transistor is in the first state or the second state after the LSB program mode. This is shown by the dashed lines appearing in FIG. 4. If the MSB of the data to be stored is "0", and if the cell transistor is in the first state after the LSB program mode, then programming is executed to bring the threshold voltage of the cell transistor from the first state to the fourth state. On the other hand, if the MSB of the data to be stored is "0", and if the cell transistor is in the second state after the LSB program mode, then programming is executed to bring the threshold voltage of the cell transistor from the second state to the third state.

FIG. 5 is similar to FIG. 4, except that binary coding has been adopted. In this case, the first through fourth threshold voltage states designate two-bit values of "11", "10", "01" and "00". Again, regardless of whether the cell transistor is in the first state or the second state after the LSB program mode, no programming is executed in the MSB mode if the MSB of the data to be stored is "1". On the other hand, if the MSB of the data to be stored is "0", then programming occurs which is dependent on whether the cell transistor is in the first state or the second state after the LSB program mode. This is shown by the dashed lines appearing in FIG. 5. If the MSB of the data to be stored is "0", and if the cell transistor is in the first state after the LSB program mode, then programming is executed to bring the threshold voltage of the cell transistor from the first state to the third state. On the other hand, if the MSB of the data to be stored is "0", and if the cell transistor is in the second state after the LSB program mode, then programming is executed to bring the threshold voltage of the cell transistor from the second state to the fourth state.

Reading of the multi-bit nonvolatile memory will be described next with reference to FIGS. 6 and 7. In particular, FIG. 6 illustrates the LSB read mode in which the logic value of the LSB of the stored data is determined. The LSB read mode involves a first LSB read operation and a conditional second LSB read operation. In the first LSB read operation, a first read voltage Vread1 is applied to the word line of cell transistor. If the cell transistor is turned ON as a result, then the cell transistor must be in the first state ("11"). If the cell transistor remains OFF, then a second LSB read operation is executed by applying a second read voltage Vread2 to the word line of the cell transistor. Here, if the cell transistor remains OFF during the second LSB read operation, the cell transistor must be in the fourth state ("01"). On the other hand, if the cell transistor turns ON during the second LSB read operation, then the LSB of the stored data is "0", but the MSB of the stored data remains unknown.

In the case of gray-coding, the MSB of the stored data can be detected by a single read operation. This is illustrated in FIG. 7 where the read operation is conducted by applying the third read voltage Vread3 to the word line of the memory cell. If the cell transistor turns ON, the MSB of the stored data is "1". If the cell transistor remains OFF, the MSB of the stored data is "0".

As should be apparent from the above, detection of the multiple bits of a multi-bit nonvolatile memory is quite complex when compared to the detection of a single-bit nonvolatile memory. Numerous challenges are encountered when designing and developing the circuitry needed to program and read the multiple bits from individual cell transistors.

SUMMARY OF THE INVENTION

According to an aspect of the present invention, a non-volatile memory device is provided which includes a non-volatile memory cell array and a page buffer. The page buffer includes a sense node selectively connected to a bit line of the memory cell array, a main latch circuit including first and second main latch nodes, where the first main latch node is selectively connected to the sense node, and a latch input node selectively connected to the first and second main latch nodes. The page buffer further includes a cache latch circuit including first and second cache latch nodes, a switching circuit which selectively connects the second cache latch node to the latch input node, and a shared sense circuit connected between to the latch input node and a reference potential. The shared sense circuit selectively connects the latch input node to the reference potential in response to a voltage of the sense node and a voltage of the first cache latch node.

According to another aspect of the present invention, a page buffer of a non-volatile memory device is provided which includes a main latch circuit, a cache latch circuit and a shared sense circuit. The shared sense circuit selectively connects main latch circuit to a reference potential in response to voltages of a sense node and the cache latch circuit.

According to yet another aspect of the present invention, a method of operating a non-volatile memory device is provide. The memory device includes a non-volatile memory cell array and a page buffer, where the page buffer includes (a) a sense node selectively connected to a bit line of the memory cell array, (b) a main latch circuit including first and second main latch nodes, wherein the first main latch node is selectively connected to the sense node, (c) a latch input node selectively connected to the first and second latch nodes, (d) a cache latch circuit including first and second cache latch nodes, (e) a switching circuit which selectively connects the second cache latch node to the latch input node, (f) and a shared sensing circuit connected between the latch input node and a reference potential. The method includes executing a multilevel cell (MLC) programming operation which includes a least significant bit (LSB) programming sequence followed by a most significant bit (MSB) programming sequence, wherein MSB programming sequence includes an initial read operation in which (a) the switching device is responsive to an initial sense control signal to connect the second cache latch node to the latch input node, and (b) the shared sensing circuit selectively connects the latch input node to the reference potential in response to a voltage of the sense node.

According to still another aspect of the present invention, a method of operating a non-volatile memory device is provided which includes using a shared sensing circuit to selectively connect a main latch circuit to a reference potential in response to voltages of a sense node and a cache latch circuit.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

The present invention will now be described by way of preferred, but non-limiting, embodiments of the invention.

Figure 8:
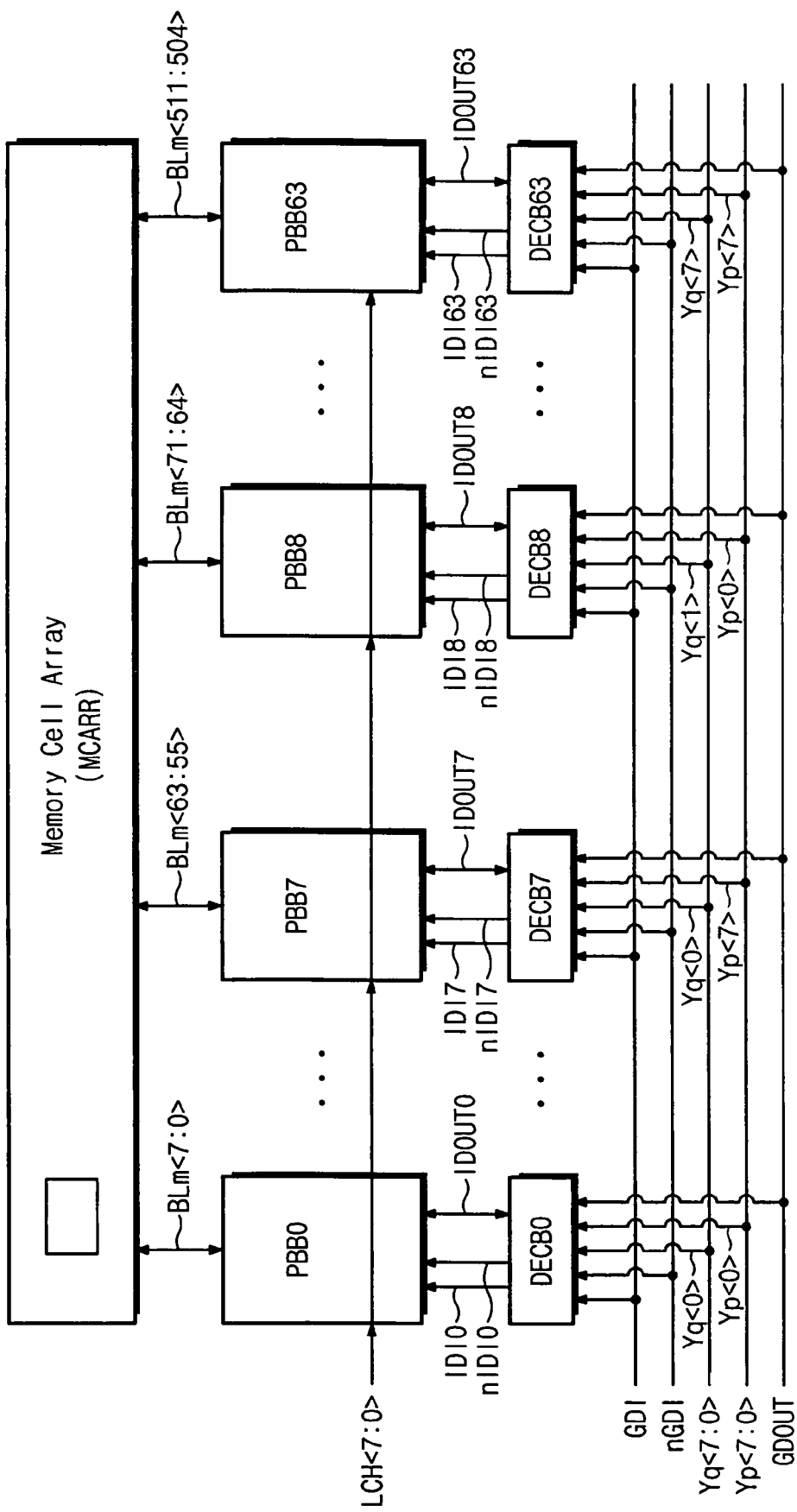
FIG. 8 is a schematic diagram of a multi-bit nonvolatile memory device according to an embodiment of the present invention.

Referring to FIG. 8, the nonvolatile semiconductor memory device of this example includes a memory cell array MCARR, page buffer blocks PBB<63:0>, first and second global input lines GDI and nGDI, a global output line GDOUT, y address signal lines Yp<7:0> and Yq<7:0>, latch signal lines LCH<7:0>, and page buffer decoders DECB <63:0>.

The memory cell array MCARR includes a matrix array of memory cells, word lines WL and bit lines BL. In the example of this embodiment, the memory cells are NAND flash memory cell transistors.

Internal input lines IDI<63:0> and nIDI<63:0>, and internal output lines IDOUT<63:0>, are connected between the page buffer decoders DECB<63:0> and corresponding page buffer blocks PBB<63:0>.

The first global input line GDI and the second global input line nGDI transmit input and control data of opposite logic states during predetermined operational intervals, such as a read mode, a program mode and an erase mode. As will be explained in more detail later, each of the page buffer decoders DECB<63:0> decodes the data GDI and nGDI, together with the y address data Yq<7:0> and Yp<7:0>, to output the data of the internal input lines IDI<63:0> and nIDI<63:0>.

Also, each of the page buffer decoders DECB<63:0> provides data corresponding to the data on the internal output lines IDOUT<63:0> to the global output line GDOUT.

Figure 9:
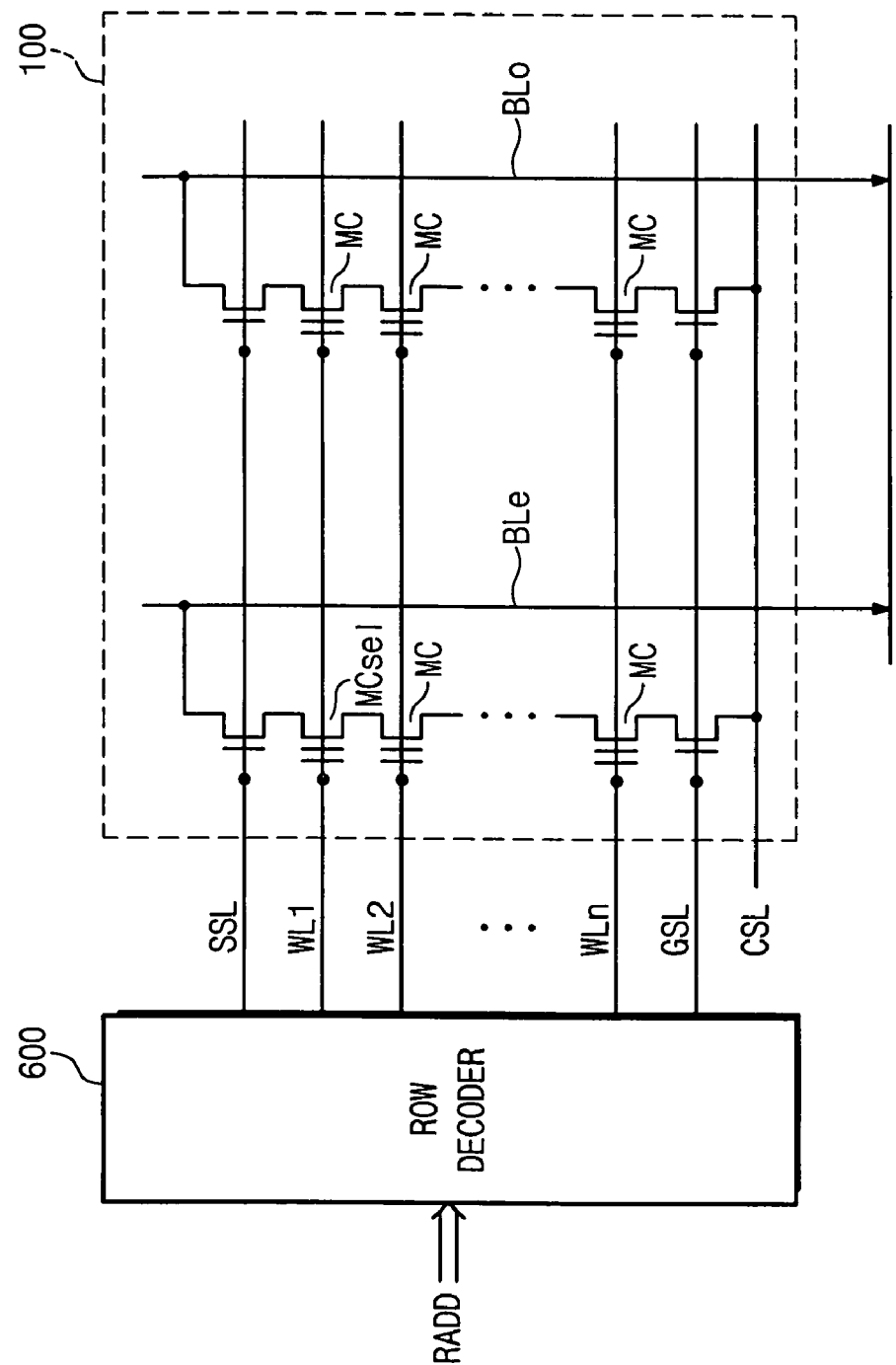
FIG. 9 is a schematic diagram of a row decoder and memory array according to an embodiment of the present invention.
Figure 11:
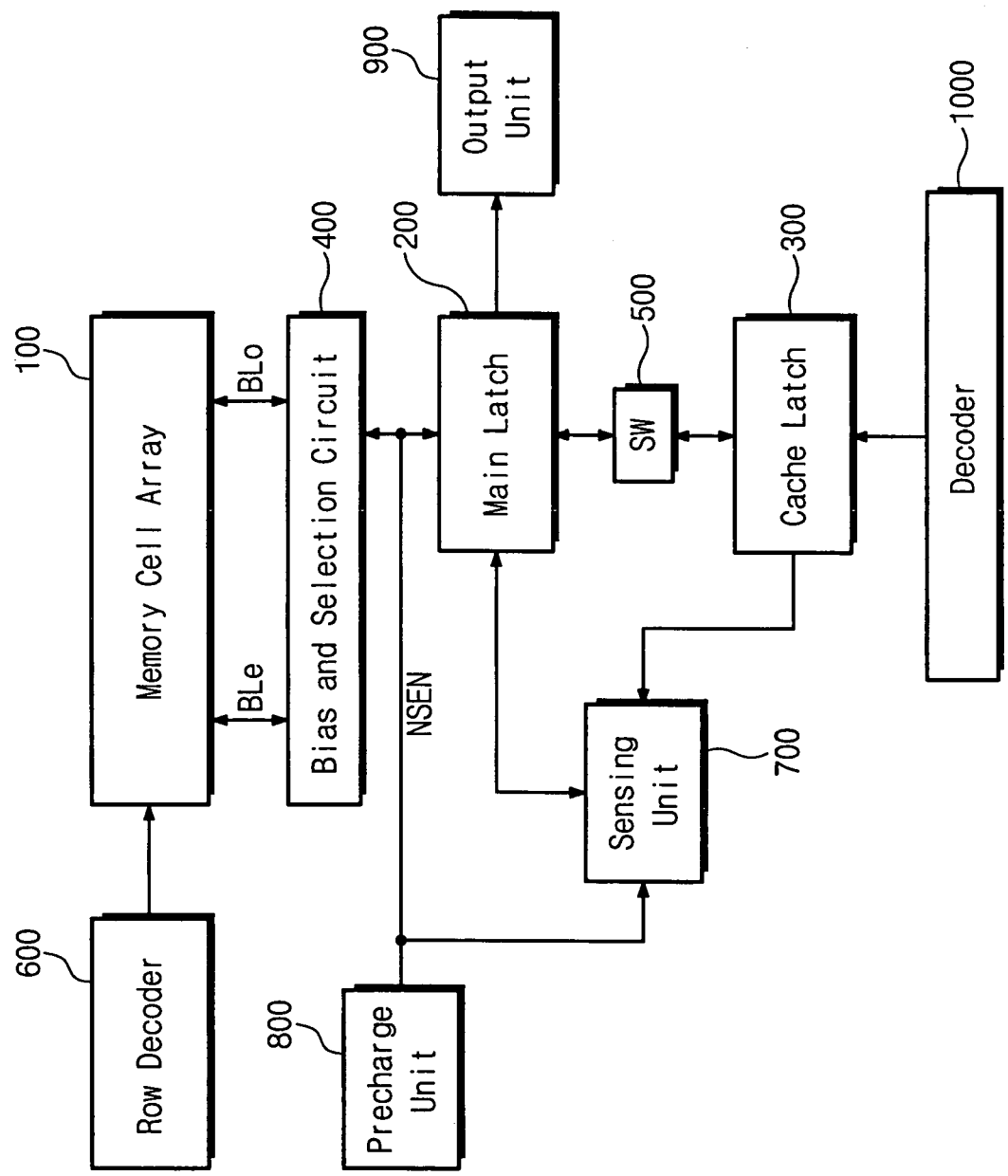
FIG. 11 is a block diagram of a multi-bit nonvolatile memory device according to an embodiment of the present invention.

FIG. 9 is a schematic block diagram of circuitry associated with a single bit line BL of the multi-bit nonvolatile memory device of FIG. 8. Illustrated in FIG. 11 are a memory cell array 100 (corresponding to a portion of the memory cell array MCARR of FIG. 8), and a row decoder 600 (not shown in FIG. 8).

NAND flash memories are characterized by serially connected strings of flash memory cell transistors, where multiple parallel strings constitute a memory block of the flash memory. Each string is comprised of a plurality of flash memory cell transistors connected in series along a bit line BL in the memory block, and word lines WL are connected to the control gates of each respective row of cell transistors in the memory block. For example, a flash memory device may contain 16 or 32 cell transistors in each string, and 4224 strings (B/L0 . . . B/L4223) in each memory block.

FIG. 9 illustrates two strings of memory cells MC each storing and outputting data through a respective even bit line BLe or odd bit line BLo. That is, according to the example of the present embodiment, each bit line BL is made up of an even bit line BLe and an odd bit line BLo. Access to these odd and even bit lines BLe and BLo will be explained in more detail later.

At opposite ends of each string are string select transistors having control gates which receive a string select signal SSL and a ground select signal GSL. Generally, the select signals SSL and GSL are utilized in reading and programming of the cell transistors. Further, at the end of each string is a common source line CSL which sets a source line voltage of the cell transistor strings of each memory block. As shown, the word line signals WL<n:1> and select signals SSL and GSL are supplied from a row decoder 600 which decodes row address signals RADD.

Figure 10:
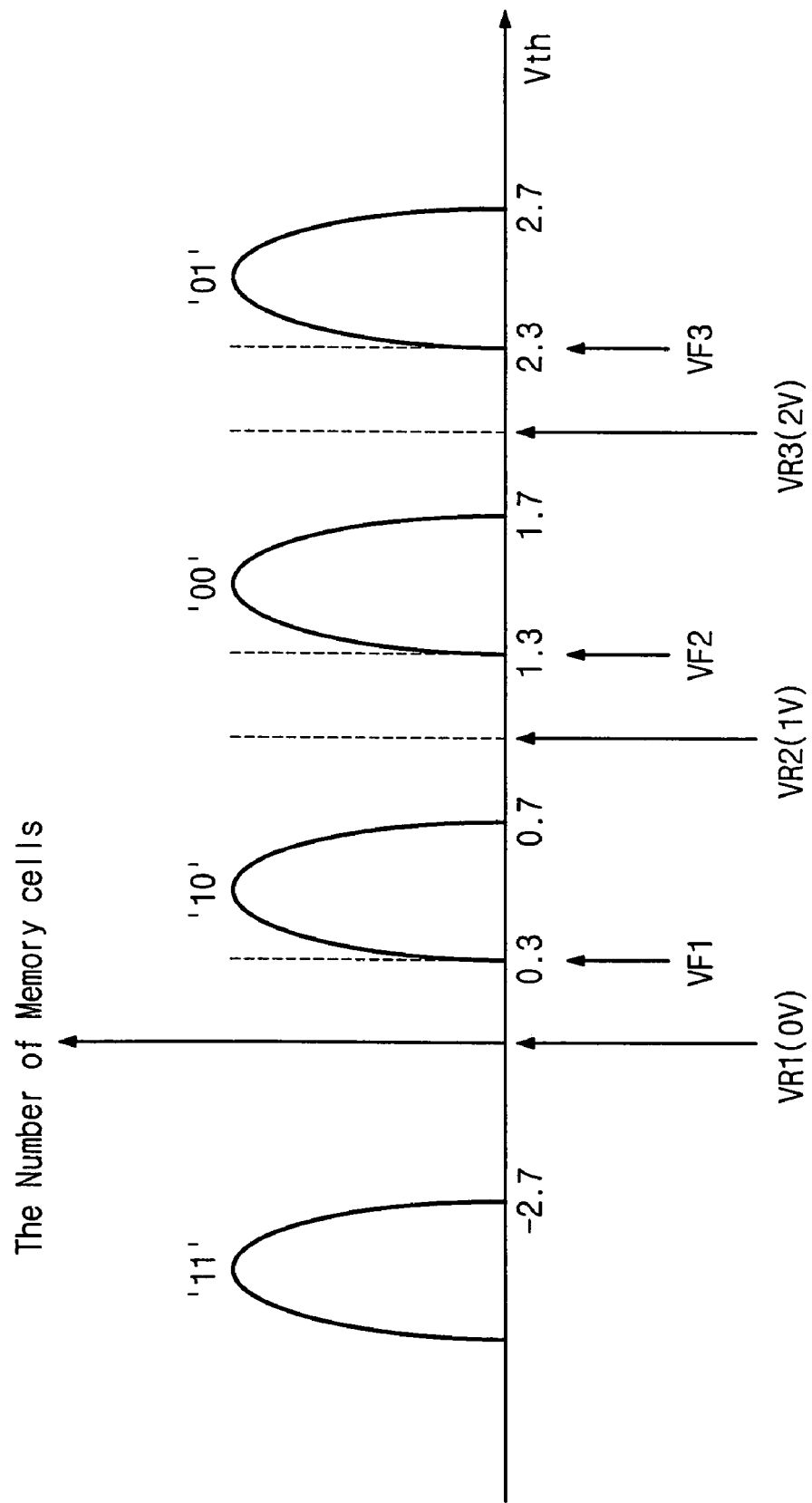
FIG. 10 is a threshold voltage distribution diagram for a multi-bit nonvolatile memory device according to an embodiment of the present invention.

Attention is directed to FIG. 10 for an explanation of the cell transistor threshold voltage distributions which constitute the various states of the multi-bit nonvolatile memory of an embodiment of the present invention. It should be understood that the voltage values presented in FIG. 10 are merely exemplary.

In the example of the present embodiment, a logic value stored in each cell transistor corresponds to at least one of four threshold voltage distribution states. Namely, as shown in FIG. 10, the examples described herein adopt a gray-coding scheme in which two-bit logic values of 11, 10, 00 and 01 are respectively designated based on four successive threshold voltage distributions (i.e., four different data states).

In the example of this embodiment, the threshold voltage ranges associated with each data state are shown in TABLE 1.

TABLE 1

| Data State | Threshold Voltage Range |
| --- | --- |
| First data state | −2.7 V or less |
| Second data state | 0.3 V~0.7 V |
| Third data state | 1.3 V~1.7 V |
| Fourth data state | 2.3 V~2.7 V |

Also, in the example of this embodiment, each data state is designated to be composed of a first bit data value and a second bit data value, where the first bit data value is a Least Significant Bit (LSB) data value and the second bit data value is a Most Significant Bit (MSB) data value. These designations are shown below in TABLE 2.

TABLE 2

| Data State | First bit data value (LSB) | Second bit data value (MSB) | Combined data value |
|---|---|---|---|
| First data state | 1 | 1 | 11 |
| Second data state | 0 | 1 | 10 |
| Third data state | 0 | 0 | 00 |
| Fourth data state | 1 | 0 | 01 |

As shown in TABLE 2, the first and fourth data states have the same first bit data value (that is, "1"), and the second and third data states have the same first bit data value (that is, "0"). Further, the first and second data states have the same second bit data value (that is, "1"), and the third and fourth data states have the same second bit data value (that is, "0").

Still referring to FIG. 10, first, second and third read voltages VR1, VR2 and VR3 are applied to the word lines WL to determine the data state of the cell transistor, i.e., to determine which two-bit value is being stored in the cell transistor. The read voltages are set in the intervals between the threshold voltage distributions of the data states, and in the example of this embodiment, the read voltages VR1, VR2 and VR3 are 0V, 1V and 2V, respectively.

For example, assume a read operation where the third read voltage VR3 is applied to a word line WL1 connected to a selected memory cell MCsel. In this case, if the selected memory cell MCsel is programmed to a data state of "11", "10" or "00", the memory cell MCsel will be turned ON in response to the third read voltage VR3 and the corresponding bit line BL will be driven to the ground voltage VSS. In contrast, if the memory cell MCsel is programmed to a data state "01", the memory cell MCsel will remain OFF and the corresponding bit line will maintain its initial voltage state. As will be explained in more detail later, the read voltages VR1, VR2 and VR3 are selectively applied to the selected word line WL1 during a read operational mode to determine the stored data state of the selected memory cell MCsel.

Also depicted in FIG. 10 are first, second and third verification read voltages VF1, VF2 and VF3. As will be discussed in more detail later, these voltages are utilized in verification read operations that are executed to confirm correct programming of the first and second bit data values in the selected memory cell MCsel. The verification read voltages VF1, VF2 and VF3 are set close to the minimum threshold voltages of the second through fourth threshold voltage distributions, respectively. In the example of this embodiment, the verification read voltages VF1, VF2 and VF3 are about 0.3V, 1.3V and 2.3V, respectively.

FIG. 11 is a block diagram of a multi-bit nonvolatile memory device according to an embodiment of the present invention. As will be explained in detail below, the multi-bit nonvolatile memory device is operative in both a multi-level cell (MLC) mode and a single-level cell (SLC) mode.

Figure 1A:
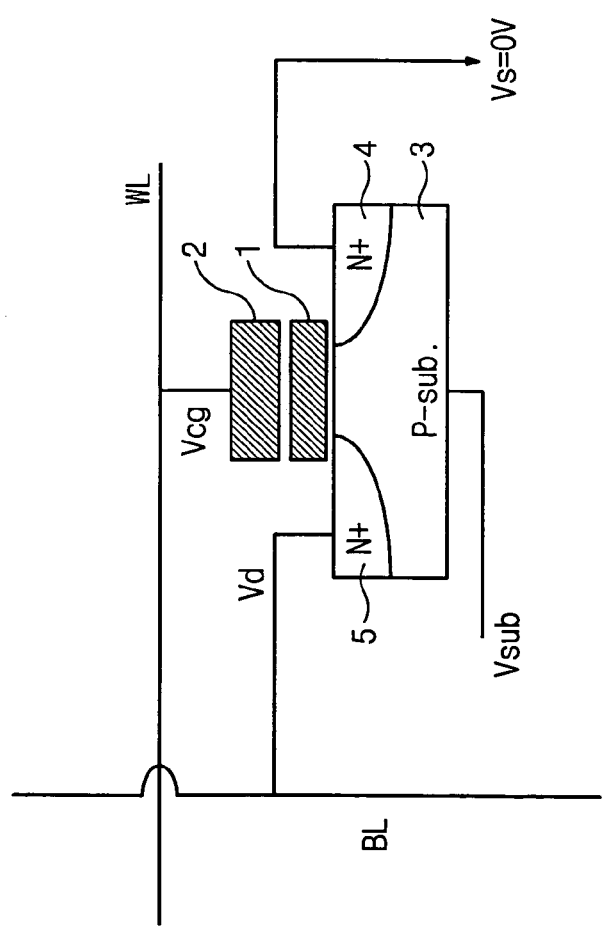
FIGS. 1A through 1C are a schematic view of a nonvolatile memory cell, the circuit symbol of a nonvolatile memory cell, and a threshold voltage characteristic of a nonvolatile memory cell, respectively.
Figure 1B:
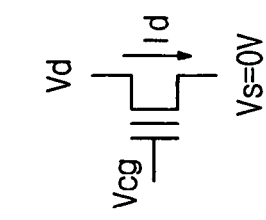
Figure 1C:
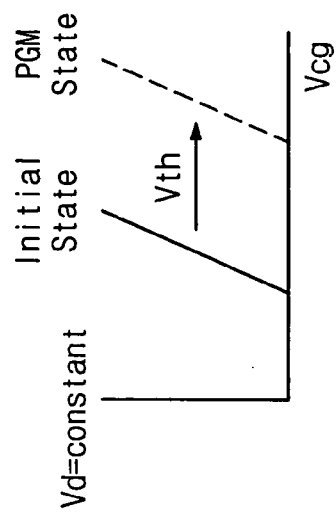
Figure 2:
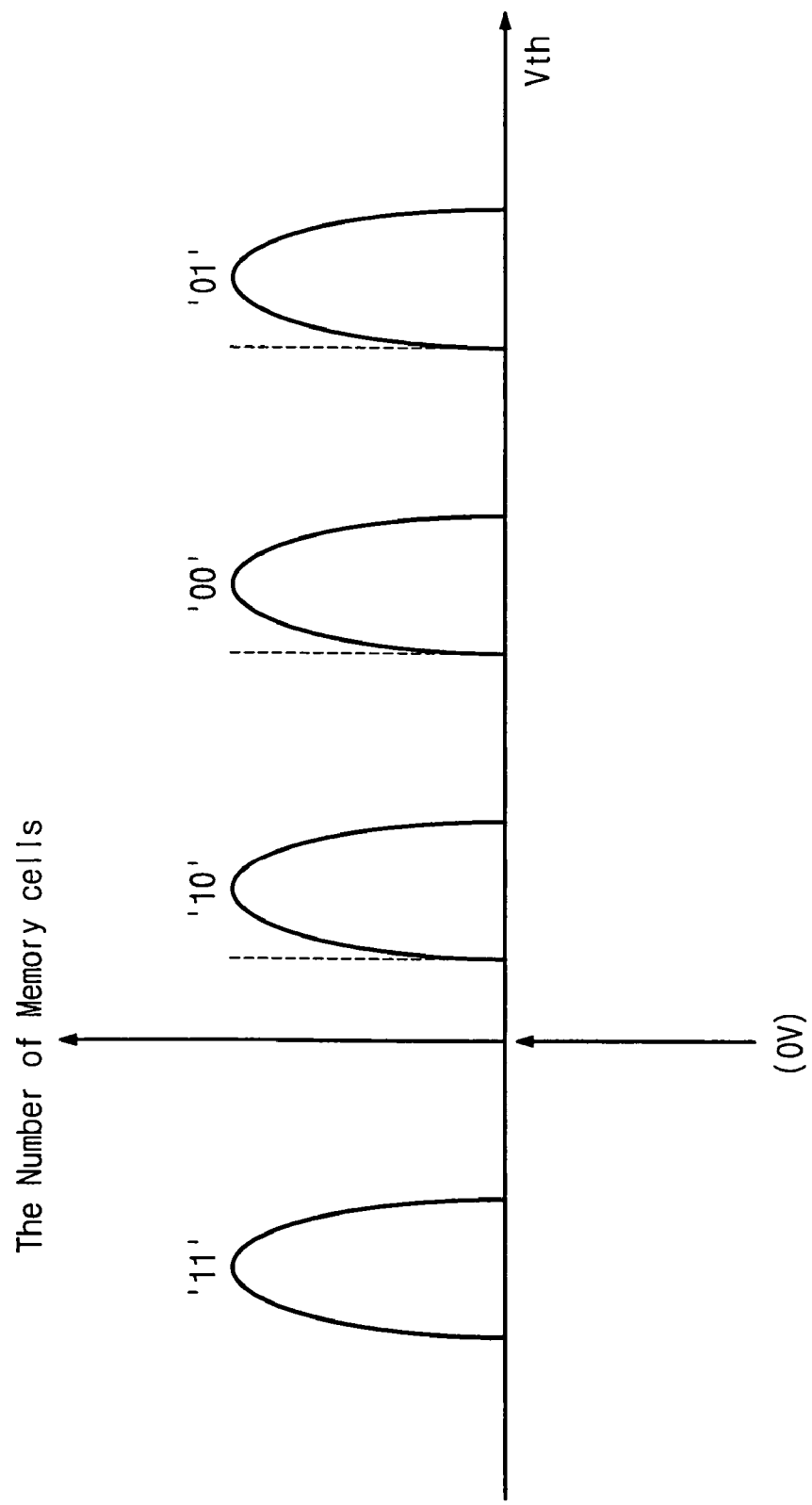
FIG. 2 illustrates threshold voltage distribution states of a multi-bit nonvolatile memory cell.

Referring to FIG. 1, reference numbers 100 and 600 denote the memory cell array and row decoder, respectively, discussed previously in connection with FIG. 9.

Also illustrated in FIG. 11 are a bias and selection circuit 400, a main latch 200, a catch latch 300, a switching circuit (SW) 500, a sensing unit 700, a precharge unit 800, an output unit 900, and a decoder 1000. An exemplary circuit configuration of each of these components is illustrated in FIG. 12.

Figure 12:
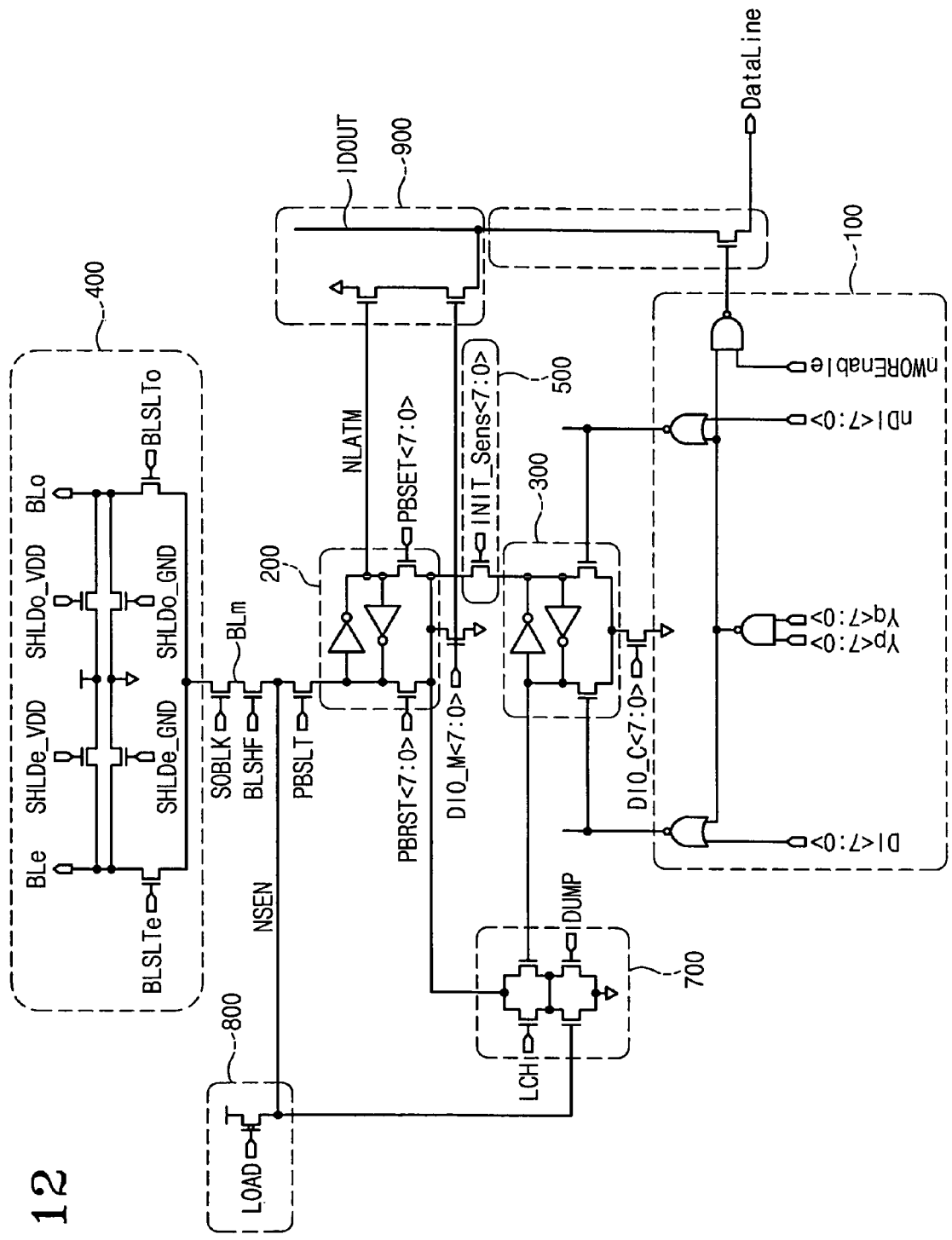
FIG. 12 is a circuit diagram of a page buffer and associated circuitry according to an embodiment of the present invention.

Referring collectively to FIGS. 11 and 12, the bias and selection circuit 400 functions to select the even bit line BLe and the odd bit line BLo, and to adjust the even bit line BLe and the odd bit line BLo to suitable voltages during read, program and erase operational modes. As shown in FIG. 12, the selection and bias circuit 400 includes two transistors gated to a high even shielding control signal SHLDe_VDD and a high odd shielding control signal SHLDo_VDD, respectively, so as to selectively apply the supply voltage VDD to the even bit line BLe and the odd bit line BLo. Similarly, two transistors are gated to a low even shielding control signal SHLDe_GND and a low odd shielding control signal SHLDo_GND, respectively, so as to selectively apply the supply voltage VSS to the even bit line BLe and the odd bit line BLo. Further, two transistors are used in the selection of either the even bit line BLe or the odd bit line BLo. Namely, two transistors are connected in the even bit line BLe and the odd bit line BLo, respectively, and are gated to an even bit line selection signal BLSLTe and an odd bit line selection signal BLSLTo.

Also shown in FIG. 12 is a transistor which receives a sensing node blocking singal SOBLK. This transistor controls access of the bias and selection circuit 400 to a main bit line BLm.

The above-mentioned control signals SHLDe_VDD, SHLDo_VDD, BLSLTe, BLSLTo, and SOBLK are preferably high voltage gate signals which exceed the supply voltage VDD.

In the example of this embodiment, the unselected one of the even bit line BLe and the odd bit line BLo acts as an interference shielding line. However, the invention is not limited to such an arrangement, and in fact, the invention is also applicable to configurations having a single bit line BL (i.e., no even and odd bit lines BLe and BLo).

In FIGS. 11 and 12, NSEN denotes a sensing node that is adapted to reflect the voltage level of the bit line BLm. As shown in FIG. 12, the sensing node NSEN is selectively connected to the bit line BLm through a bit line shutoff transistor that is responsive to a bit line shutoff signal BLSHF. In this example, the bit line shutoff transistor is a low voltage NMOS transistor.

The pre-charge unit 800 pre-charges the sensing node NSEN to a predetermined pre-charge voltage. In this embodiment, the pre-charge voltage is the supply voltage VDD. When a selected memory cell MCsel is an "on cell", the voltage level of the sensing node NSEN decreases to the ground voltage VSS. On the other hand, when the selected memory cell MCsel is determined to be an "off cell", the sensing node NSEN may or may not be maintained at the supply voltage VDD depending on operations of the main latch 200 and cache latch 300 (described later).

The pre-charge unit 800 of this example includes a PMOS transistor that is provided with a source terminal connected to the supply voltage VDD and is gated to a pre-charge signal LOAD.

The output driving unit 900 is enabled in response to an output from the decoder 100. An internal output line IDOUT is driven to a predetermined output driving voltage which depends on main latch data stored on main latch node NLATM. The internal output line IDOUT is electrically isolated from the main latch node NLATM and internal data signals DI and nDI. As such, inadvertent driving of the main latch node NLATM caused by data loaded on the internal output line IDOUT is prevented.

In this example, the output driving unit 900 includes first and second output driving transistors 220 connected in series between an output driving voltage and the internal output line IDOUT. The first output driving transistor is gated to the main latch node NLATM, while second output driving transistor is gated to a main cache drive signal DIO_M<7:0>. In the example, the output driving voltage is the ground voltage VSS.

According to the example of this embodiment, when the main latch node NLATM is logic "H", the internal output line IDOUT is driven to the ground voltage VSS in response to the transition of the decoder 1000 output to a logic "H" state. On the other hand, when the main latch node NLATM is logic "L", the first output driving transistor is turned off. In this case, regardless of whether the voltage level of the decoder 1000 output is changed to a logic "H" state, the internal output line IDOUT maintains its high voltage state. In this example, the high voltage state of the internal output line IDOUT is the supply voltage VDD.

The main latch unit 200 and the cache latch 300 each include a latch circuit as shown, as well as first and second transmission transistors. The first and second transmission transistors of the main latch unit 200 are gated to receive page buffer set and reset signals PBRST<0:7> and PBSET<0:7>, respectively. The first and second transmission transistors of the cache latch 300 are gated to receive the internal data signals IDI and nIDI, respectively. Further, a main latch drive transistor is connected as shown in FIG. 12 to drive the main latch 200 in response to the main latch drive signal DIO_M<0:7>. Likewise, a cache latch drive transistor is connected as shown to drive the cache latch 300 in response to a cache latch drive signal DIO_C<0:7>. Generally, the main latch drive signal DIO_M<0:7> and the cache latch drive signal DOI_C<0:7> are obtained by decoding of y-address signals.

The sensing unit 700 operates under control of a latch signal LCH, a dump signal DUMP, the sense node NSEN, and the cache latch 700. In this example, the sensing unit 700 includes four transistors connected between the main latch 200 and a reference potential (ground) as shown. As will be explained later, this circuit functions as a common sense and dump unit for the page buffer.

The switching unit 500 of this example includes a transistor connected between the main latch unit 200 and the cache latch unit 300. This transistor operates in response to a sense signal INIT_Sens<0:7>.

The decoder 1000 has two primary functions, both of which are dependent on the y-address signals Yp<7:0> and Yq<0:7>. First, the decoder 1000 controls transmission of output data corresponding to data on the internal output line IDOUT to an external output line DataLine. In this example, this control is affected by generating a gate voltage applied to the output unit 900 in accordance with an enable signal nWOREnable and the y-address signals Yp<7:0> and Yq<0:7>. Second, the page buffer decoder 1000 decodes data corresponding to input data DI and nDI into the first internal input data IDI and the second internal input data nIDI, respectively. Again, this is done in accordance with the y-address signals Yp<7:0> and Yq<0:7>. In the specific example of FIG. 12, the decoder 1000 includes two NOR gates and two NAND gates connected as shown. It should be readily apparent, however, that other combinations of logic elements may be adopted.

An exemplary description of the operation of the multi-level non-volatile memory of FIGS. 11 and 12 will be described next.

Initially, an LSB reading operation of an MLC page buffer operational mode will be described with reference to the flow diagram of FIG. 13, the circuit diagrams of FIGS. 14 through 18, and the timing diagram of FIG. 31.

The LSB reading operation of the MLC page buffer operational mode is generally characterized by a first sensing at the read voltage VR1 of FIG. 10, followed by a second sensing at the read voltage VR3 of FIG. 10. For ease of reference, each of FIGS. 14 through 18 include a diagram of threshold voltage maps, where "A" corresponds to the read voltage VR1, "B" corresponds to the read voltage VR2, and "C" corresponds to the read voltage VR3.

Figure 13:
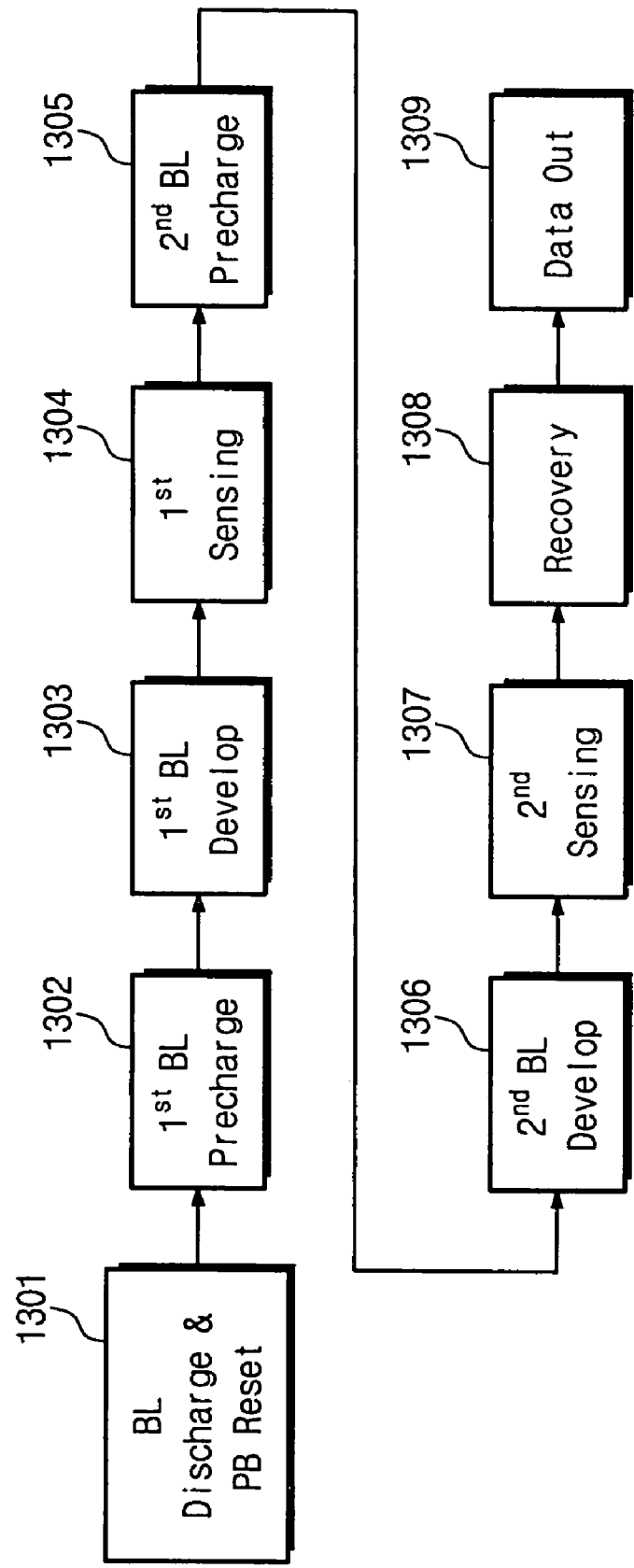
FIG. 13 is a flow diagram for use in explaining an LSB reading in an MLC mode of a multi-bit nonvolatile memory device according to an embodiment of the present invention.
Figure 14:
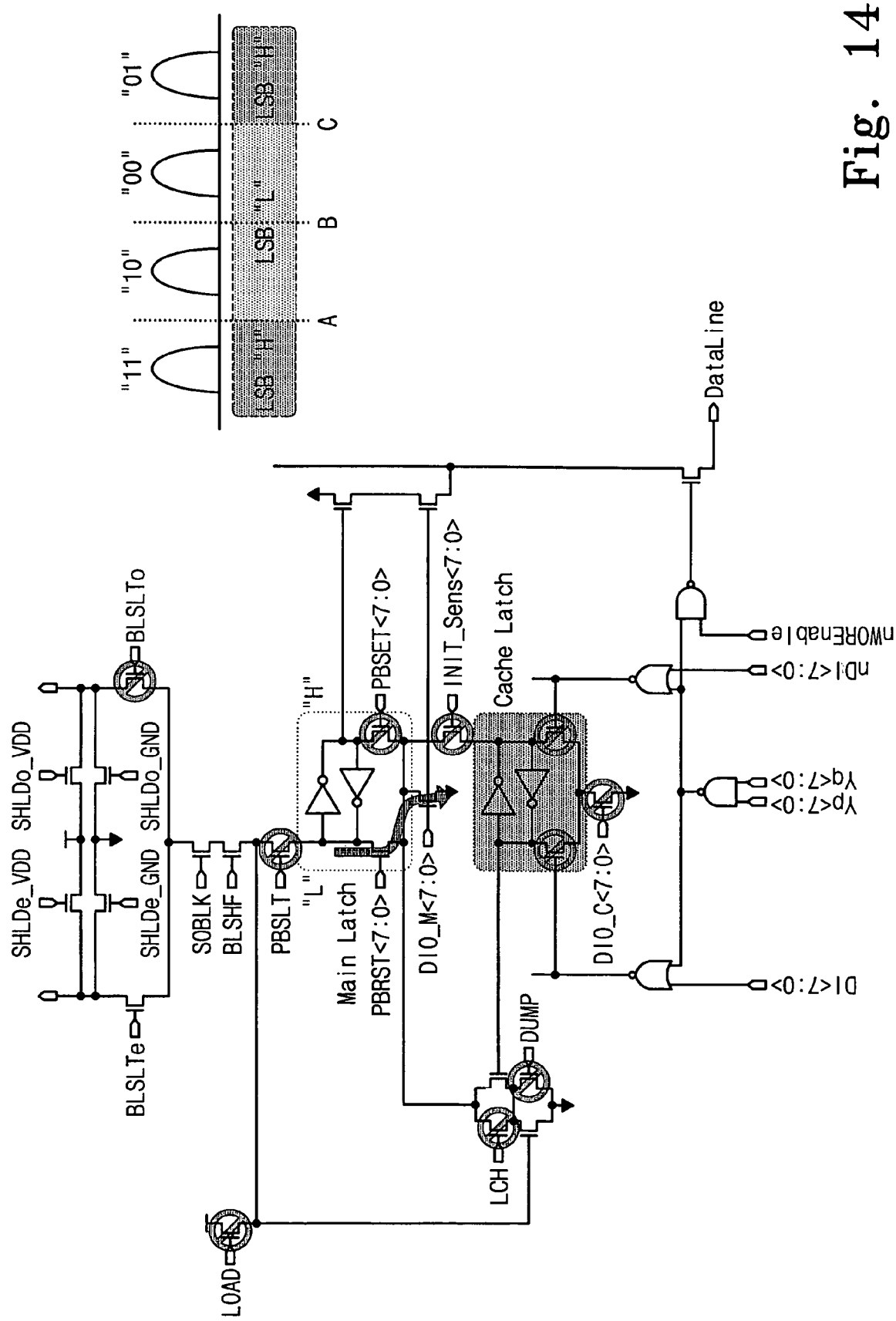
FIGS. 14 through 18 are circuit diagrams for use in explaining an LSB reading in an MLC mode of a multi-bit nonvolatile memory device according to an embodiment of the present invention.
Figure 31:
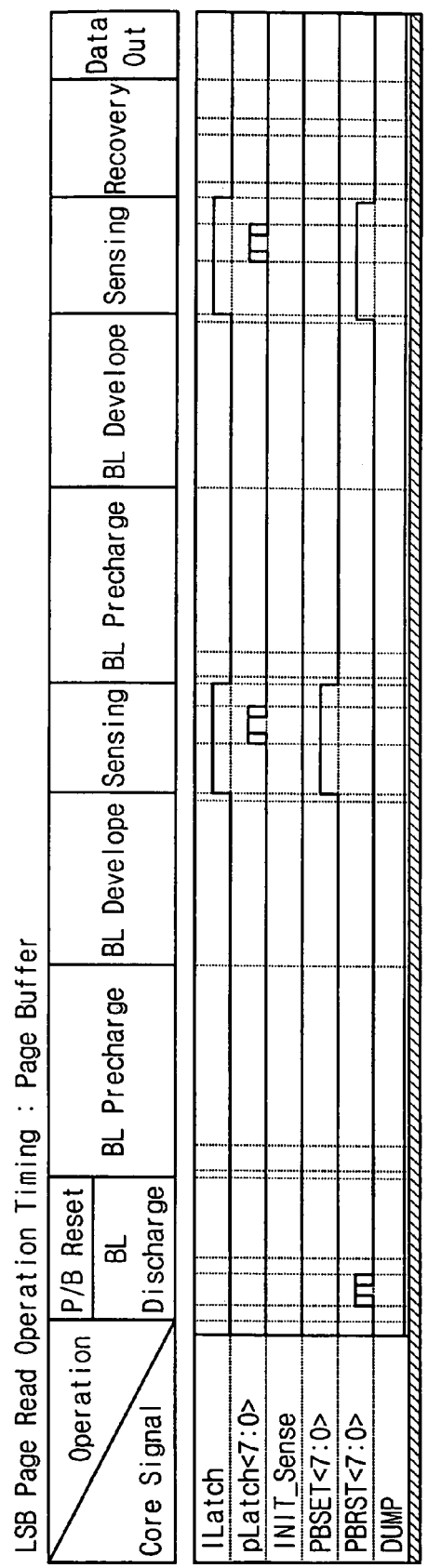

Referring to FIGS. 13, 14 and 31, initially at step 1301, the (main) bit line BL is discharged and the page buffer is reset. Generally, the page buffer is reset by activating the page buffer reset signal PBRST and the main latch drive signal DIO_M. Thus, the main latch node NLATM goes to HIGH.

Figure 15:
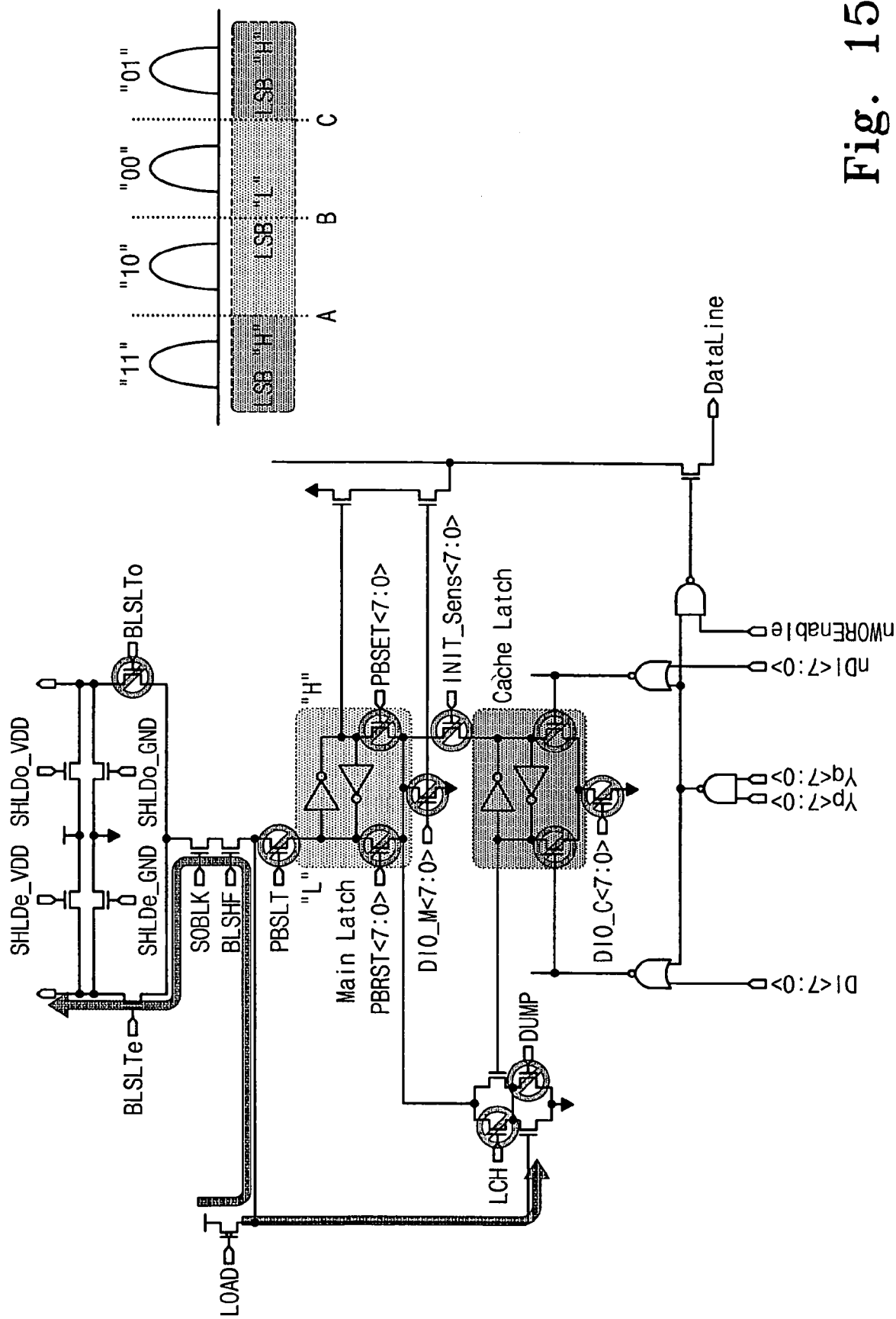

Next, at step 1302, the bit line is pre-charged as represented in FIG. 15. Here, the load signal LOAD goes low to connect the reference voltage to the sense node, and the main bit line BL is connected to even bit line BLe by activating the control signals BLSLTe, SOBLK and BLSHF.

Figure 16:
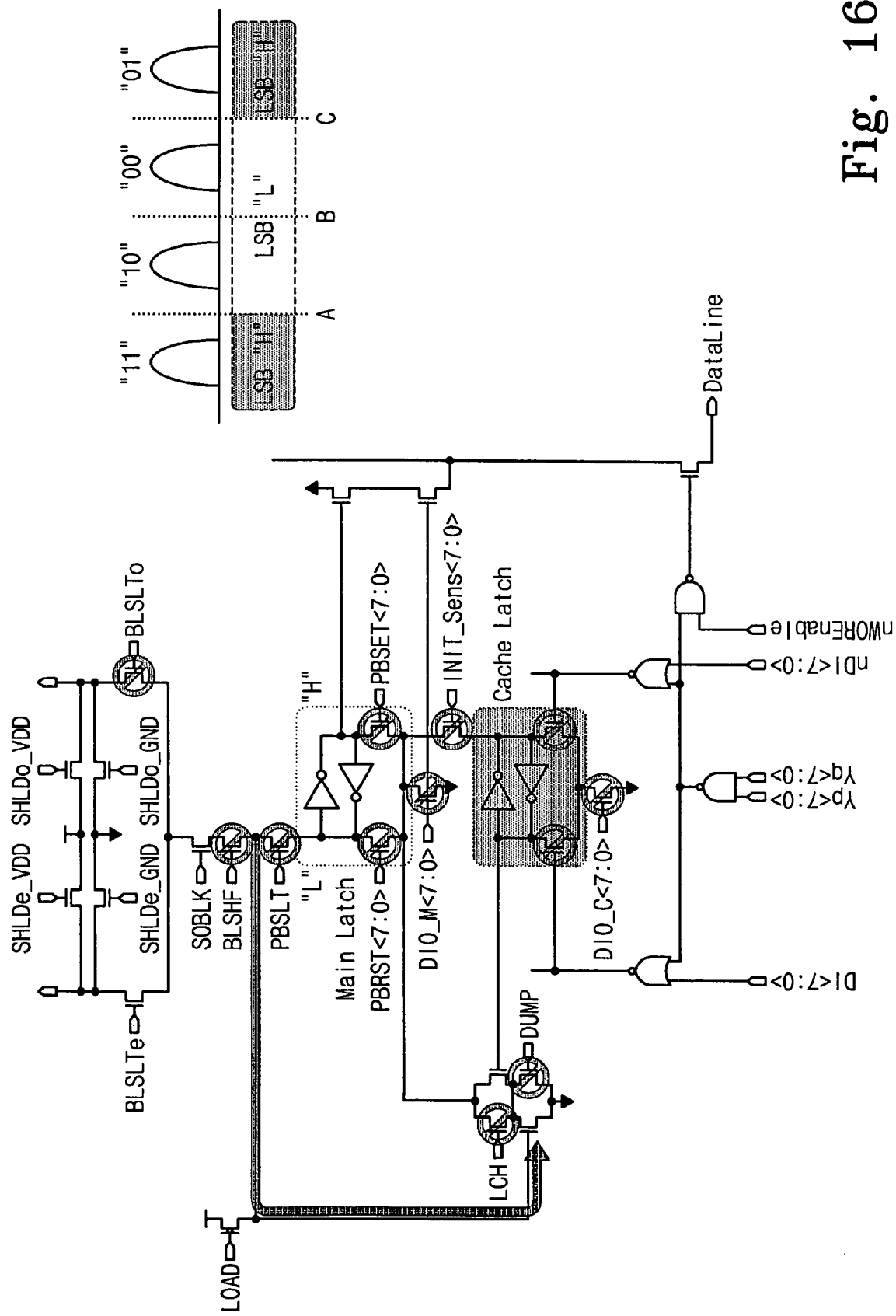

Next, at step 1303, the bit line is developed as represented in FIG. 16. Here, the control signal BLSHF is deactivated, thus shielding the main bit line from the even bit line BLe.

Figure 17:
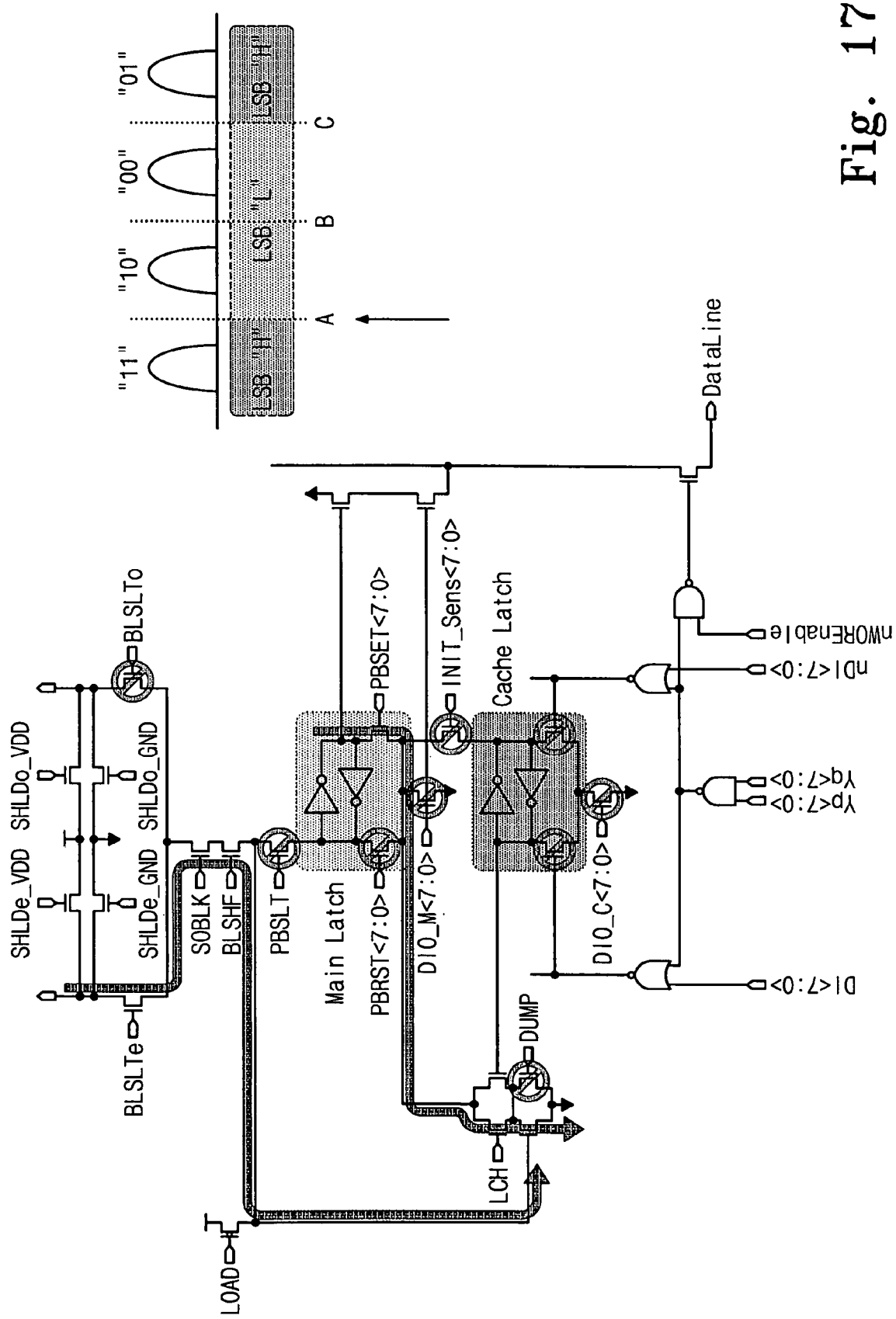

Next, at step 1304, a sensing and latch operation is carried out with respect to the read voltage "A" (VR1 of FIG. 10) as represented in FIG. 17. As shown, the control signal BLSHF, page buffer set signal PBSET, and the latch signal LCH are activated. Thus, depending on the state of the sense node NSEN, the main latch 200 either maintains is preset state or is logically flipped.

Figure 18:
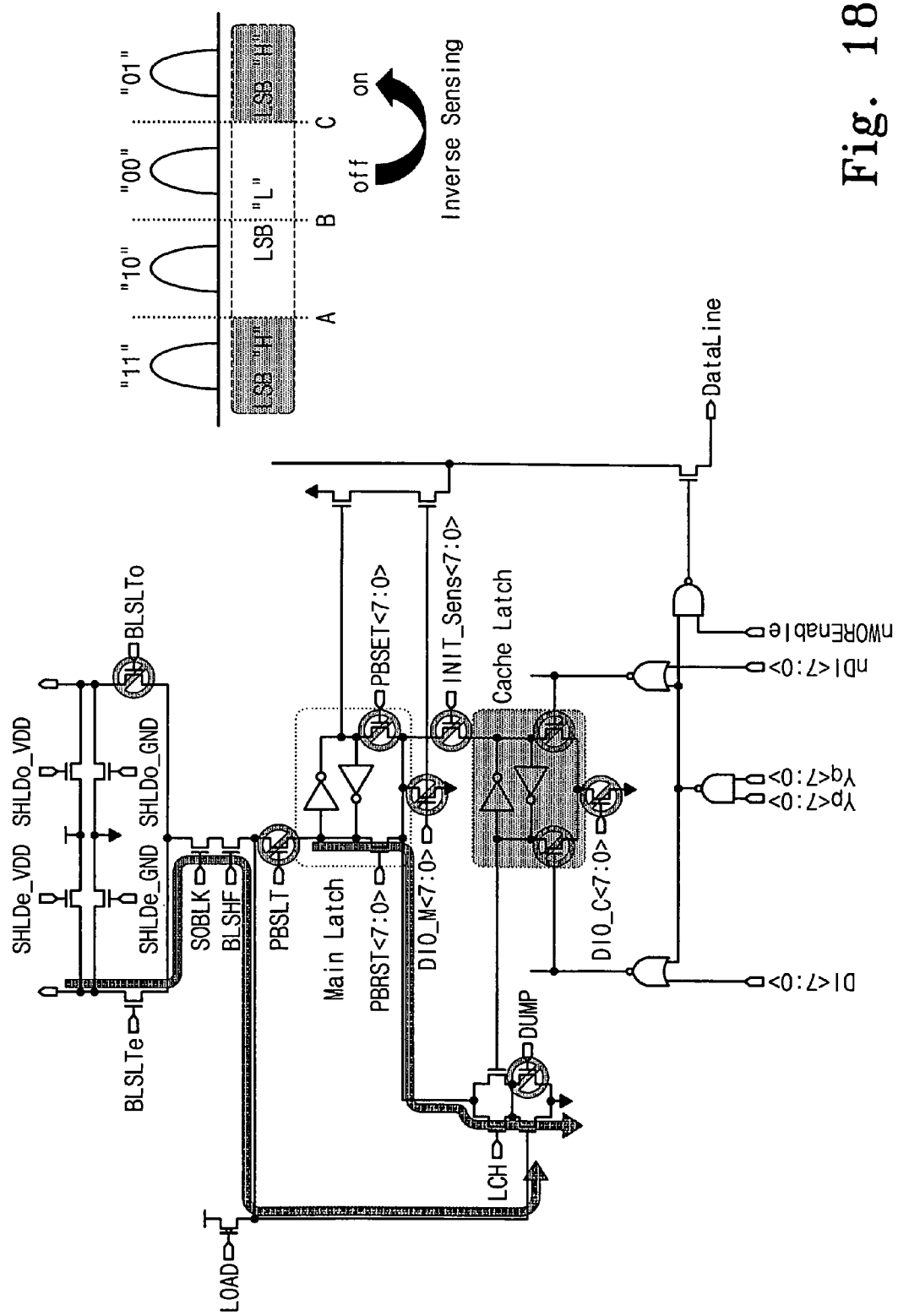

Steps 1305, 1306 and 1307 are then executed in the same manner as previously described steps 1301, 1302, and 1303. However, the second pre-charge step 1305 does not include resetting of the main latch. Further, the sensing and latch operation of step 1037 is executed with respect to the read voltage "C" (VR3 of FIG. 10). Step 1307 is generally represented in FIG. 18 where inverse sensing with respect to the read voltage "C" is shown. Here, the control signals BLSLTe, SOBLK and BLSHF, the page buffer reset signal PBRST, and the latch signal LCH are all activated. Thus, depending on the state of the sense node NSEN, the main latch 200 either maintains is preset state or is logically flipped.

Step 1308 of FIG. 13 generally denotes a recovery interval which occurs after the second sensing step 1308, and step 1309 generally denotes a data output step in which the data appearing on the main latch node NLAT is output to the external data line DataLine.

Figure 32:
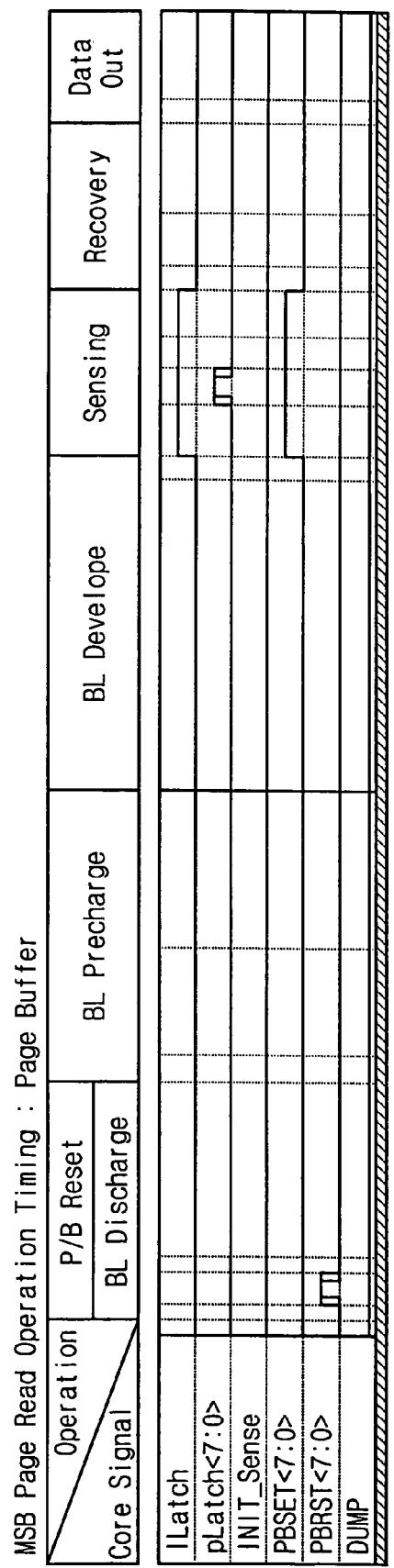

An MSB reading operation of an MLC page buffer operational mode will be described with reference to the flow diagram of FIG. 19, the circuit diagrams of FIG. 20, and the timing diagram of FIG. 32.

The MSB reading operation of the MLC page buffer operational mode is generally characterized by a sensing at the read voltage VR2 of FIG. 10.

Figure 19:
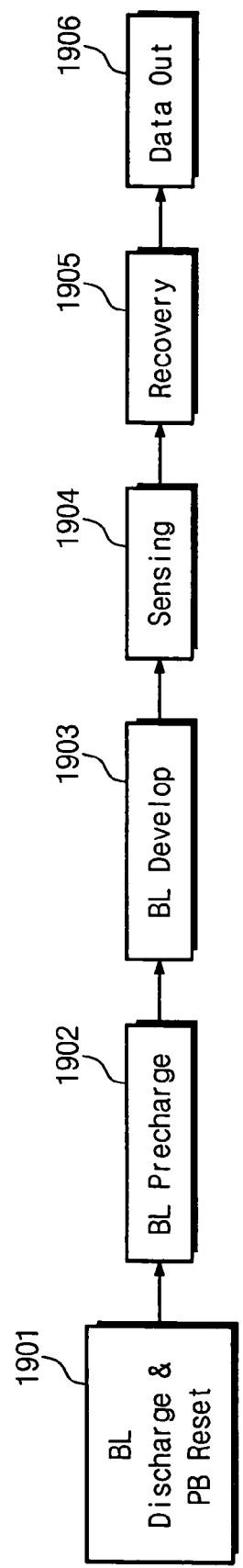
FIG. 19 is a flow diagram for use in explaining an MSB reading in an MLC mode of a multi-bit nonvolatile memory device according to an embodiment of the present invention.
Figure 20:
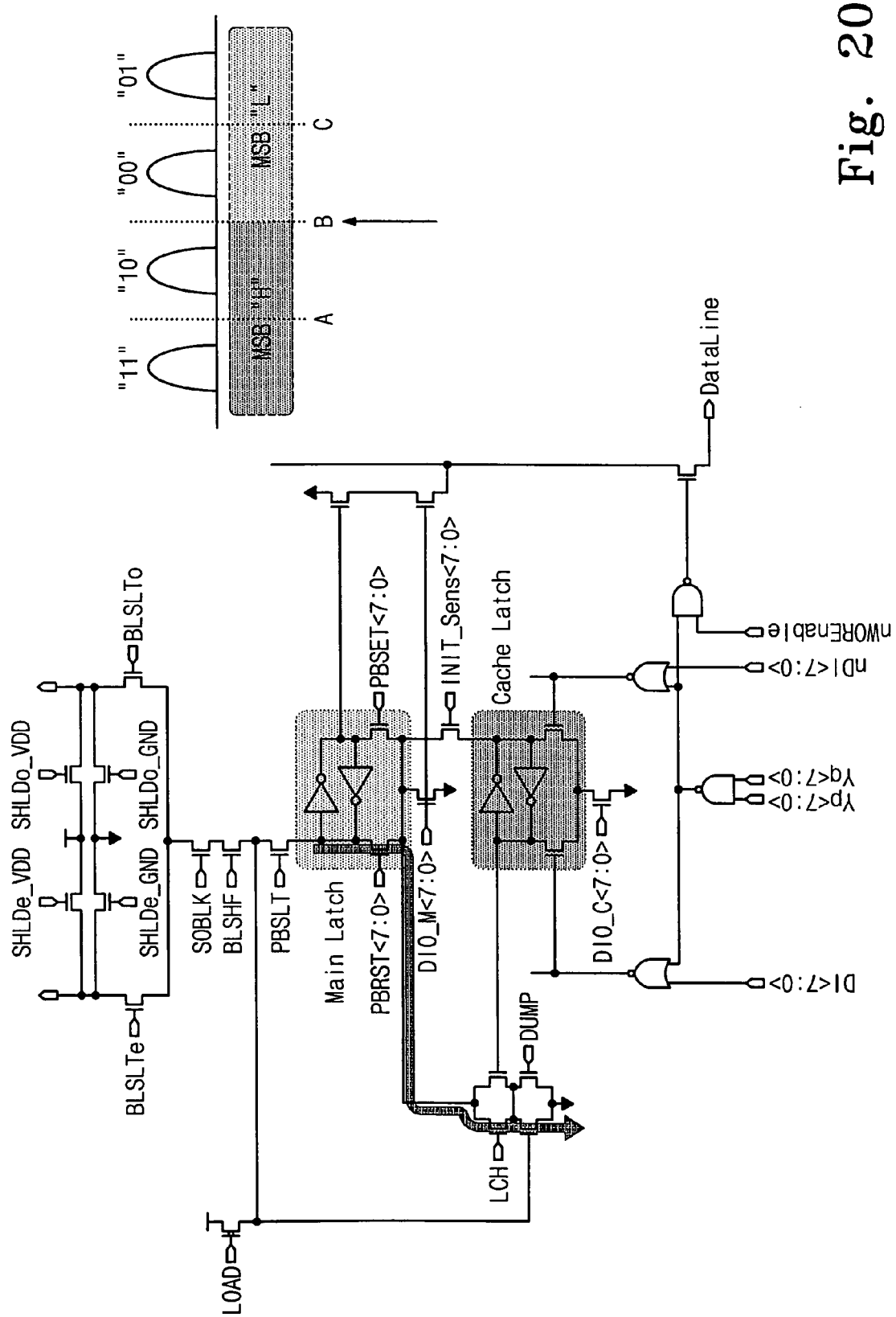
FIG. 20 is a circuit diagram for use in explaining an MSB reading in an MLC mode of a multi-bit nonvolatile memory device according to an embodiment of the present invention.

Referring to FIG. 19, the MSB reading operation includes a bit line discharge and page buffer reset step 1901, a bit line pre-charge step 1902, a bit line development step 1303, a sensing step 1904, a recover step 1905, and a data output step 1906. These steps are generally the same as the like-named previous steps of previously described FIG. 13, except that the sensing step 1904 is executed with respect to the read voltage "B" (VR2). As such, a detailed description of FIG. 19 is omitted here to avoid redundancy. The circuit diagram of FIG. 20 illustrates the sensing step 1904. For ease of reference, each of FIGS. 14 through 18 include a diagram of threshold voltage maps, where "A" corresponds to the read voltage VR1, "B" corresponds to the read voltage VR2, and "C" corresponds to the read voltage VR3. Here, the control signals BLSLTe, SOBLK and BLSHF, the page buffer reset signal PBRST, and the latch signal LCH are all activated.

Thus, depending on the state of the sense node NSEN, the main latch 200 either maintains is preset state or is logically flipped.

Figure 21:
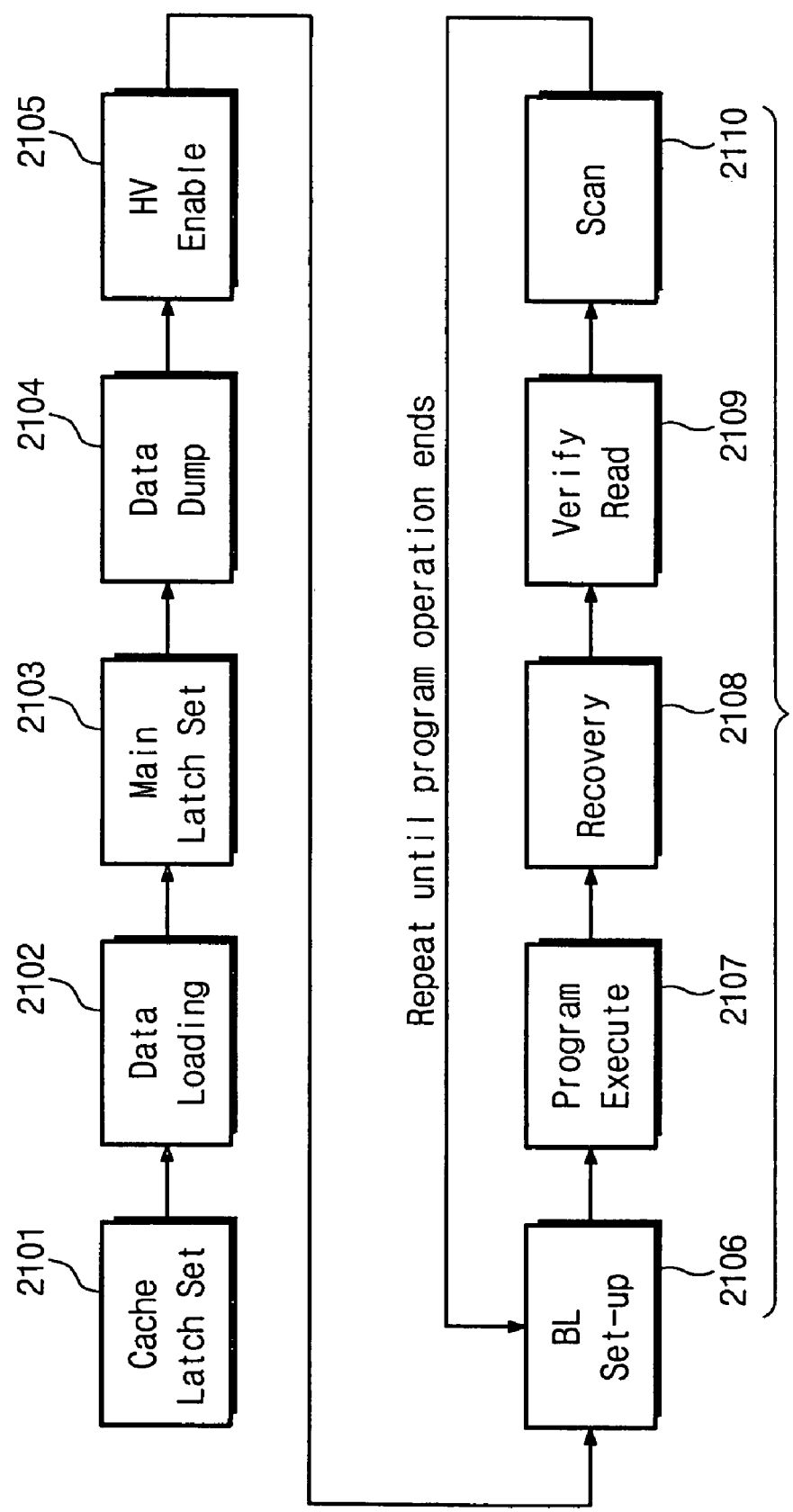
FIGS. 21 and 22 are flow diagrams for use in explaining LSB programming and MSB programming, respectively, in an MLC mode of a multi-bit nonvolatile memory device according to an embodiment of the present invention.
Figure 22:
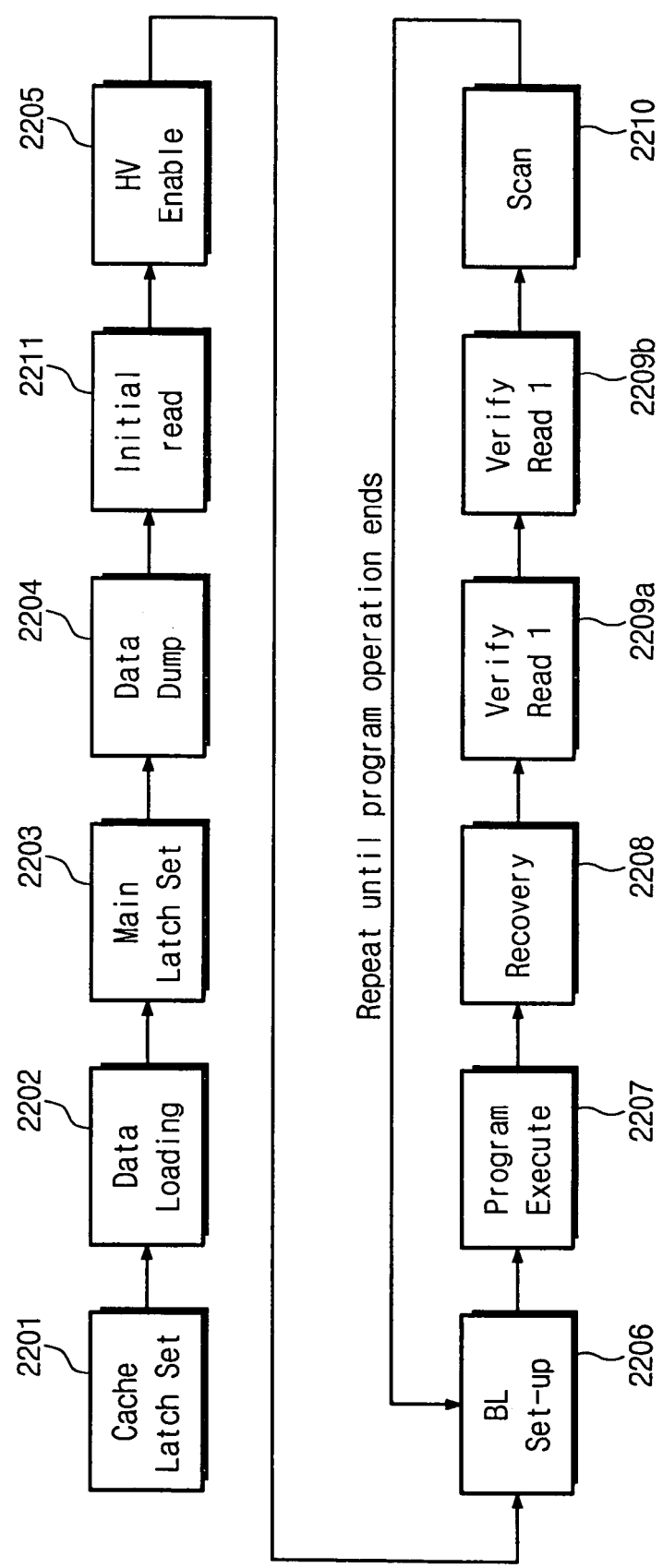

A programming operation in an MLC page buffer operational mode will be described with reference to the flow diagrams of FIG. 21 and 22, the circuit diagrams of FIGS. 23 through 27, and the timing diagram of FIG. 30.

In the example that follows, the nonvolatile memory cells are selectively programmable in any one of at least first, second, third and fourth threshold voltage states, and where the first, second, third and fourth threshold voltage states define data values "11", "10", "00" and "01", respectively The MCL programming operation includes an LSB programming operation, followed by an MSB programming operation. The LSB programming operation is represented by the flow diagram of FIG. 21, and the MSB programming operation is represented by the flow diagram of FIG. 22. By comparing these flow diagrams, it becomes apparent that the LSB and MSB programming operations are substantially the same, except for the initial read step 2211 and the dual read verify steps 2209a and 2209b of the MSB programming operation.

In particular, the LSB programming operation includes setting of the cache latch (step 2102), loading of data (step 2102), setting of the main latch 2103, a data dump operation (step 2104), and a high voltage (HV) enable operation (step 2105). Further, the LSB programming operation includes set-up of the bit line BL (step 2106), program execution (step 2107), a recovery internal (2108), a read verification (step 2109), and a scan interval (step 2110). Each of these steps will be described in more detail below in the context of the MSB programming operation.

The MSB programming operation will now be described in detail with reference to the flow diagram of FIG. 22, the timing diagram of FIG. 30, and the circuit diagrams of FIGS. 23 through 27.

Figure 3:
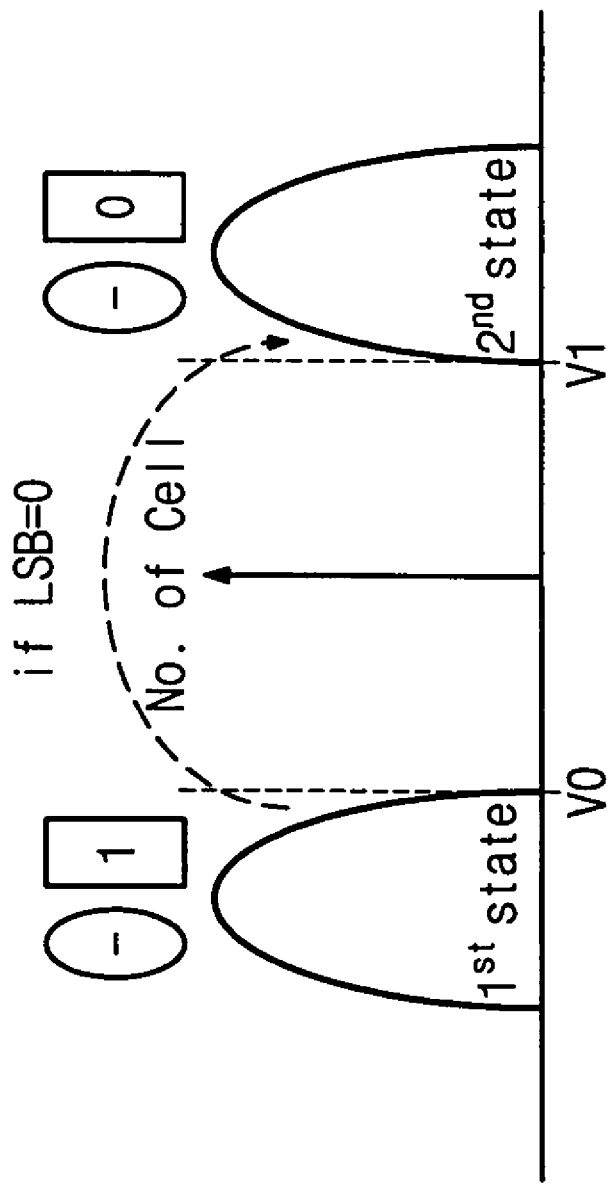
FIGS. 3 through 5 are threshold voltage distribution diagrams for explaining the programming of a multi-bit nonvolatile memory cell.
Figure 4:
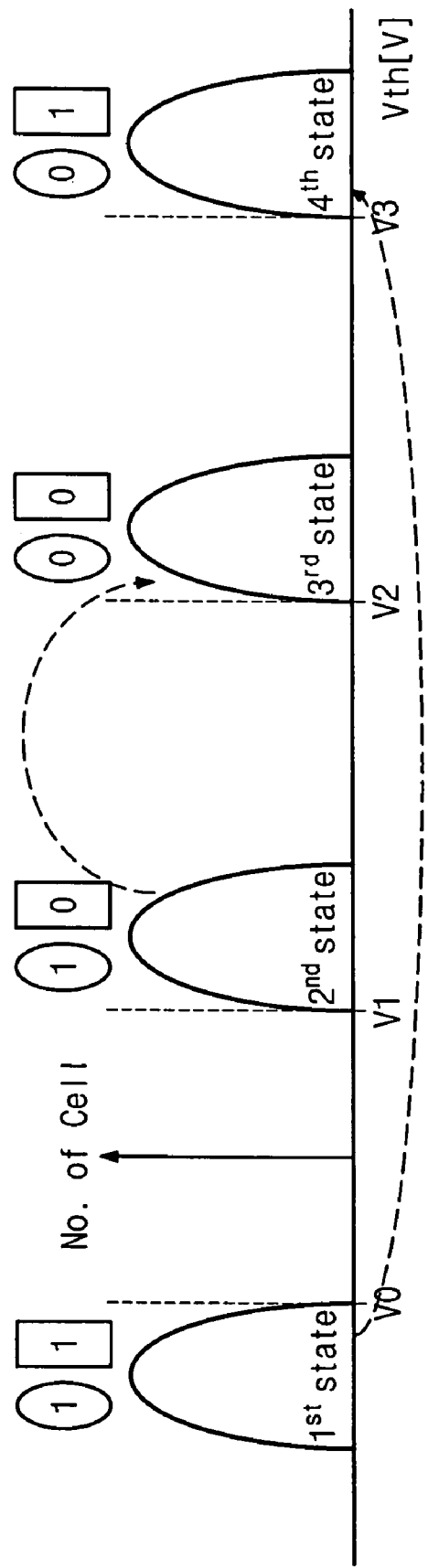
Figure 5:
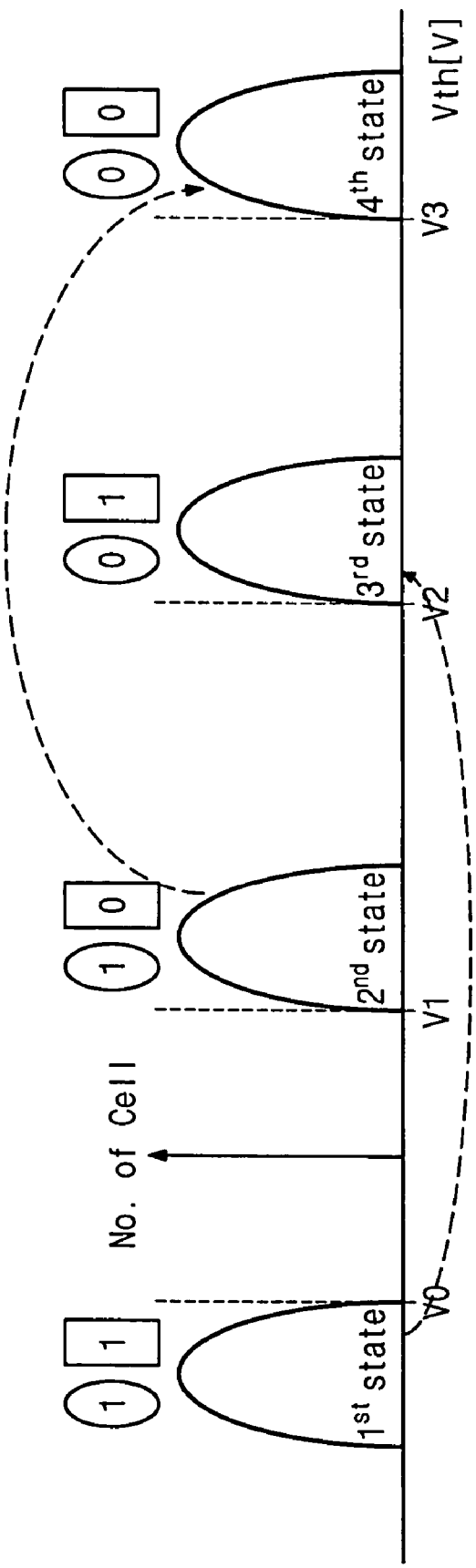
Figure 6:
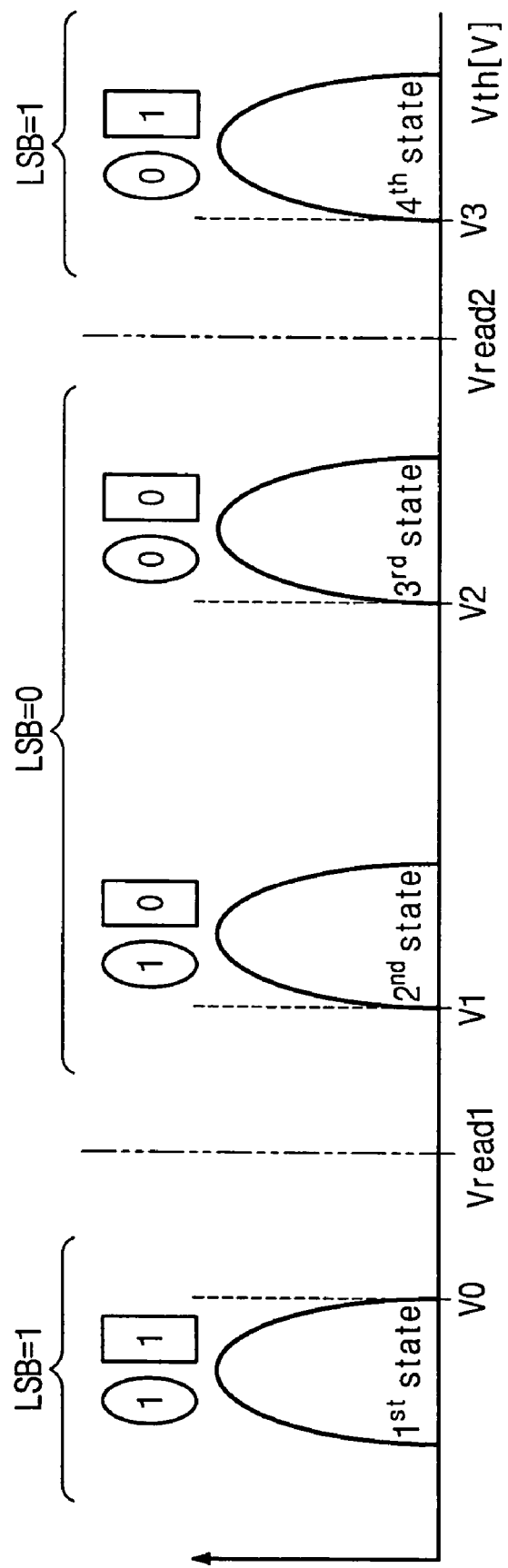
FIGS. 6 and 7 are threshold voltage distribution diagrams for explaining the reading of a multi-bit nonvolatile memory cell.
Figure 7:
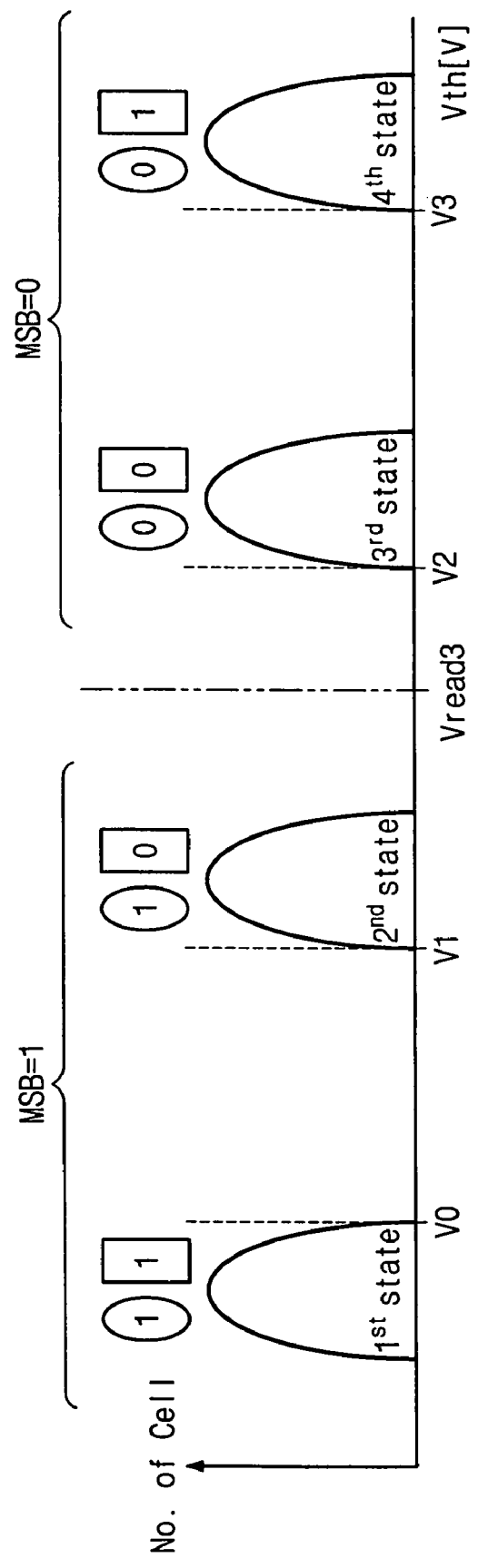
Figure 23:
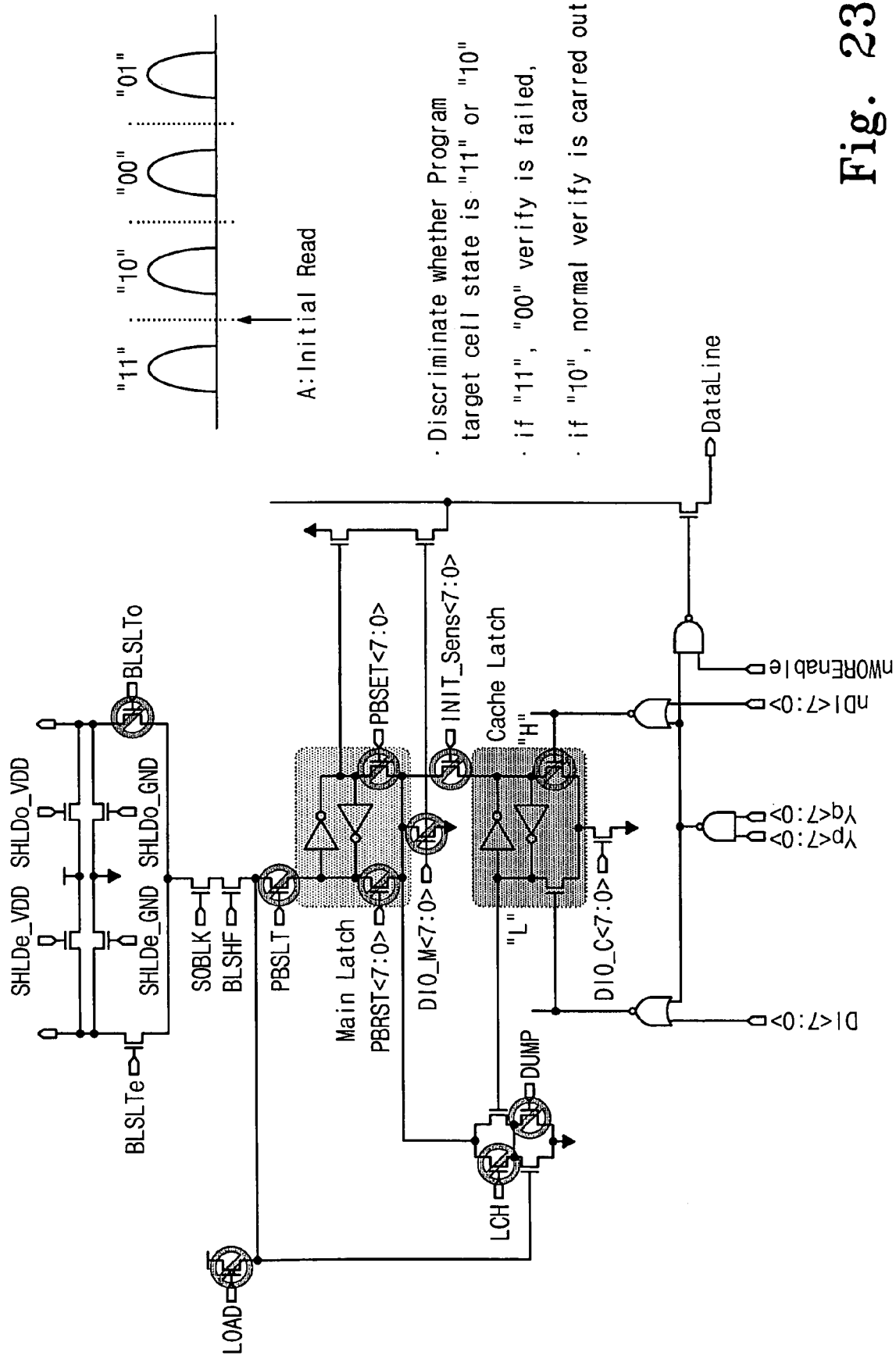
FIGS. 23 through 27 are circuit diagrams for use in explaining programming in an MLC mode of a multi-bit nonvolatile memory device according to an embodiment of the present invention.
Figure 24:
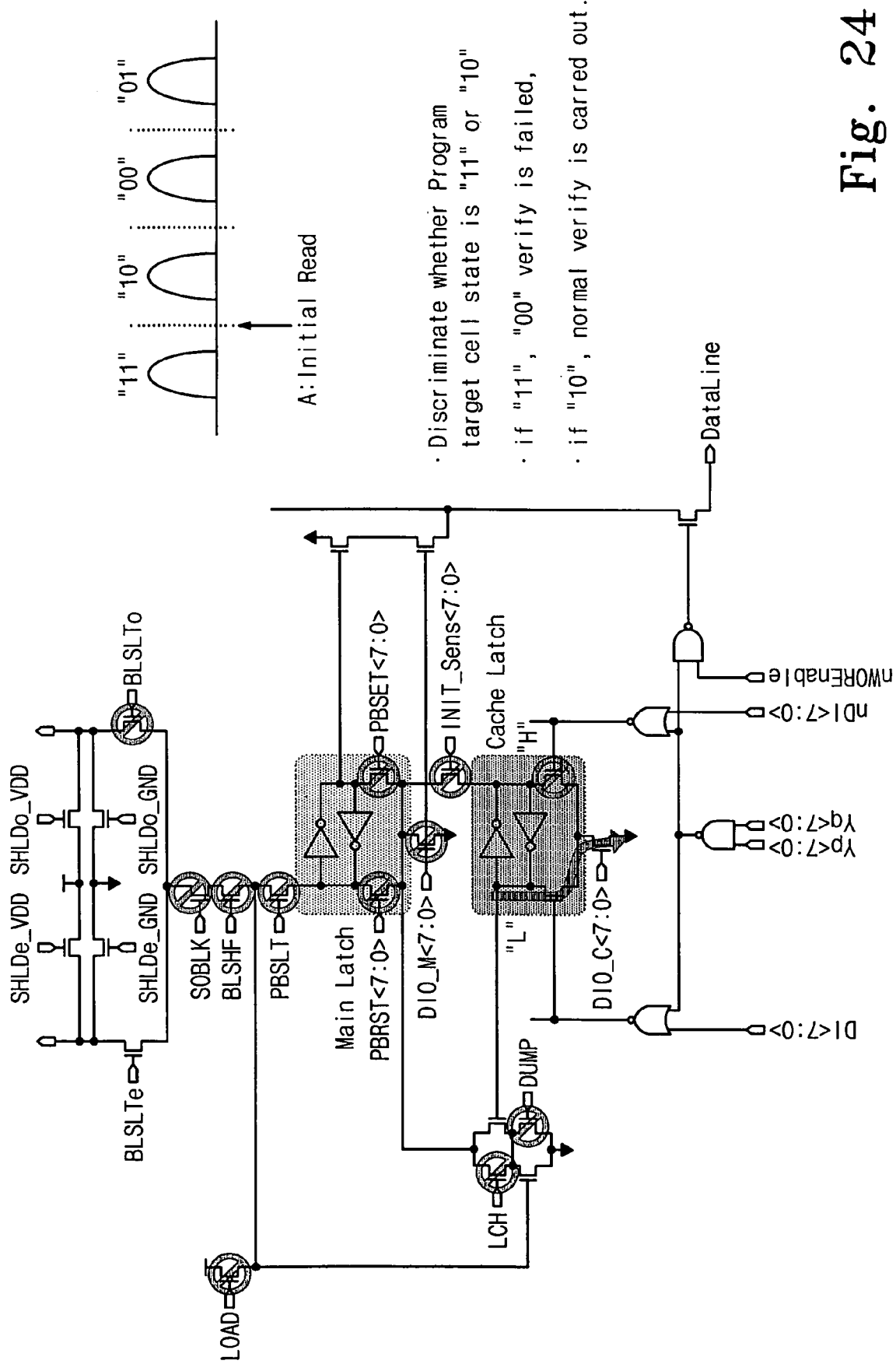

Initially, at step 2201, the cache latch 300 is set by activating the cache latch drive signal DIO_C and in response to the data signal DI. This is represented in FIG. 24. Next, at step 2202, data is loaded into the cache latch 300 as represented in FIG. 23. Then, referring to the timing diagram of FIG. 3, the main latch is set at step 2103 and a data dump operation is executed at step 2104.

Figure 25:
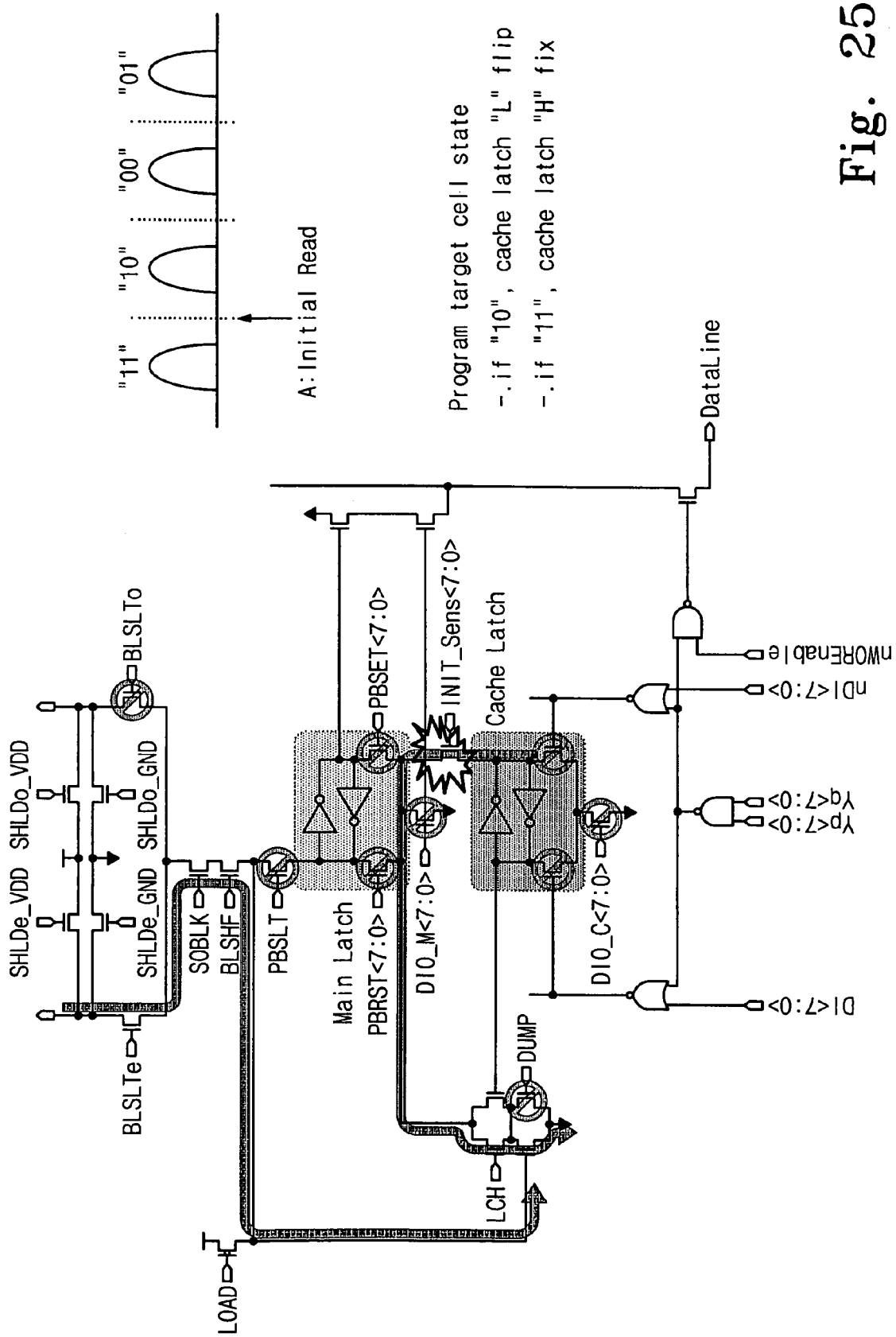

Next, at step 2211, an initial read operation is executed in which the switching device 500 is responsive to the control signal INIT_Sens to connect the cache latch circuit 300 to an input node of the main latch circuit 200. In addition, the latch control signal is turned turn ON, and the dump control signal is turned OFF. The initial read operation is represented in FIG. 25.

Figure 30:
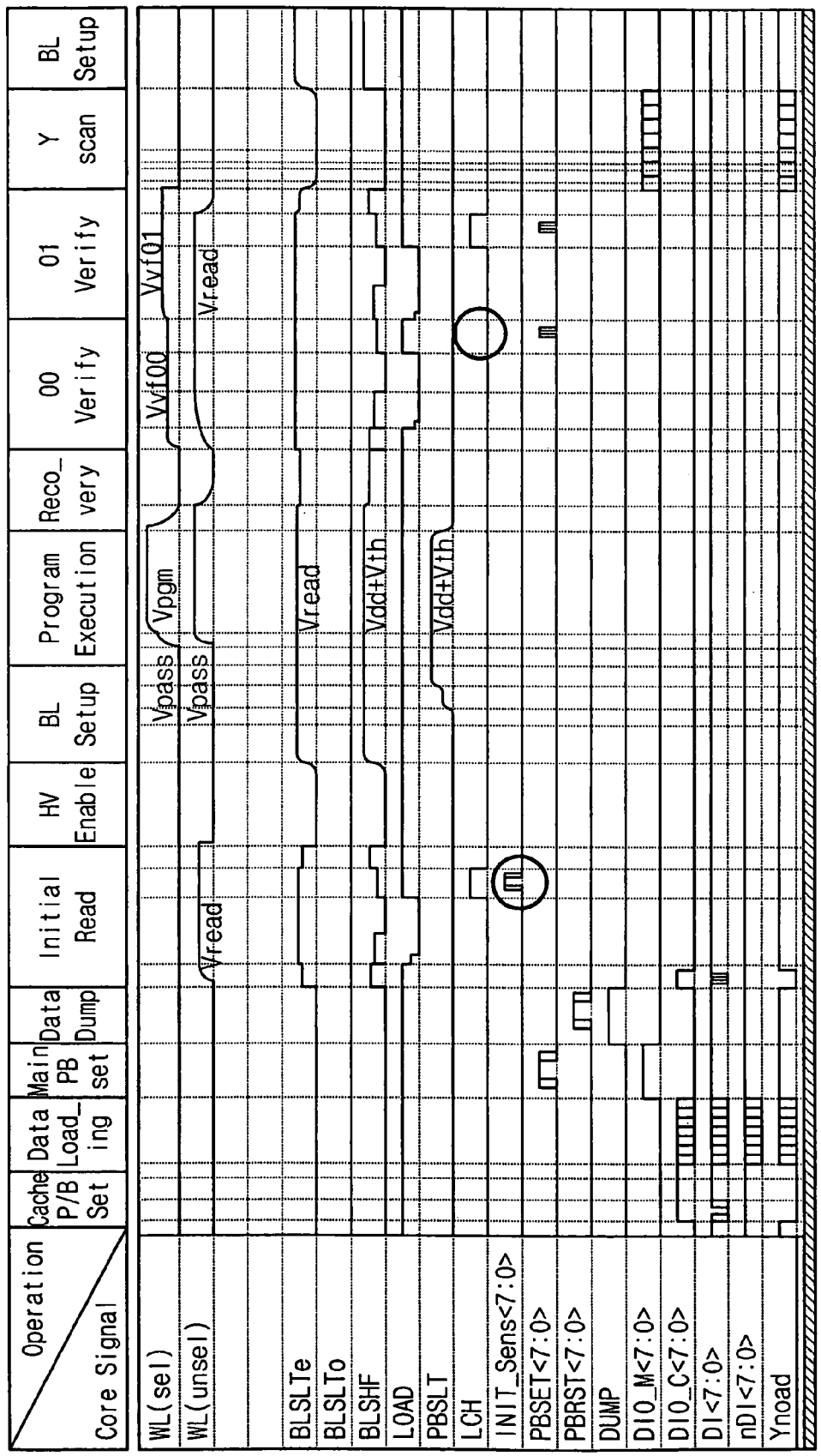
FIGS. 30 through 32 are timing diagrams for use in explaining operations of a multi-bit nonvolatile memory device according to an embodiment of the present invention.

Referring to FIG. 30, after the initial read operation, a high voltage enable operation is executed at step 2105, the bit line BL is set up at step 2106, and programming of the target memory cell is executed at step 2107. The programming execution is followed by a recovery interval at step 2108.

Figure 26:
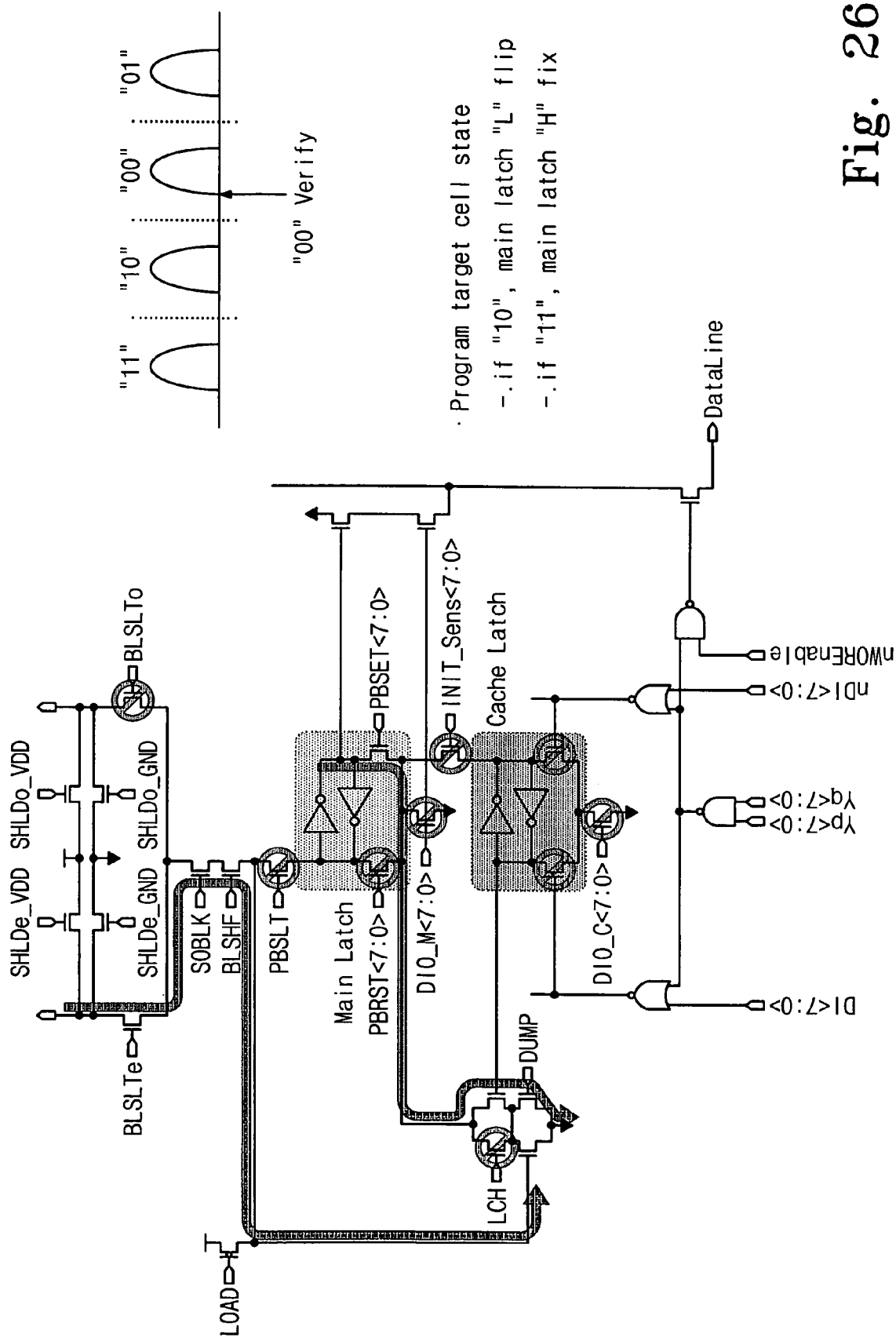
Figure 27:
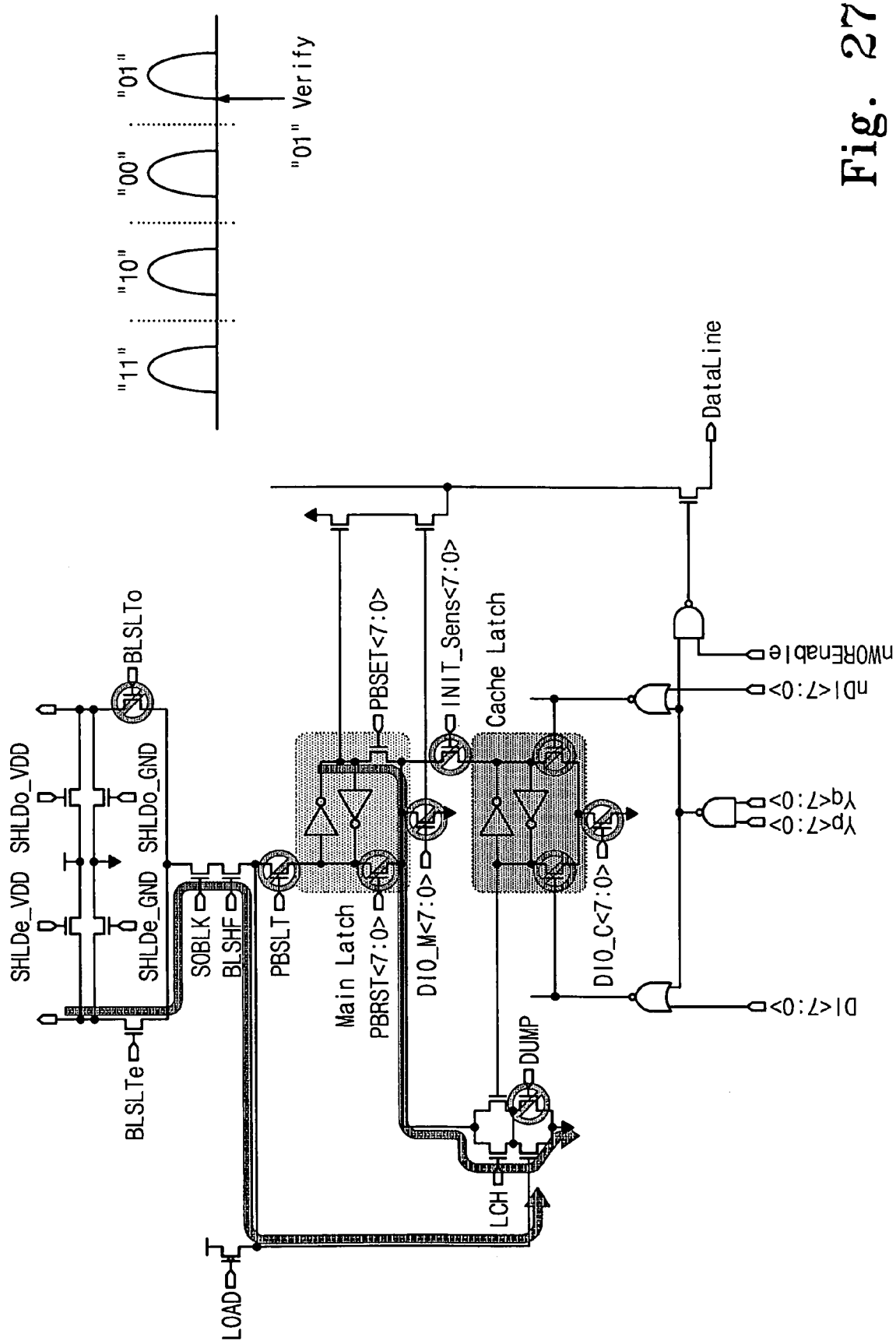

Next, at steps 2209a and 2209b, first and second read verification operations are executed. In this example, the first read verification is a "00" verification operation in which the latch control signal LCH is OFF and the dump control signal DUMP is ON, and the switching device 500 disconnects the cache latch circuit 300 from an input node of the main latch circuit 200. The second read verification is a "01" verification operation in which the latch control signal LCH is ON, the dump control signal DUMP is OFF, and the switching device 500 disconnects the cache latch circuit 300 from an input node of the main latch circuit 200. These first and second read verification operations are represented in FIGS. 26 and 27, respectively.

Step 2210 denotes a scan interval in which an assessment is made as to whether the target memory cell has been properly programmed based on results of the first and second read verification operations. If the target memory cell has not been properly programmed, the programming sequence returns to the bit line set-up step 2206 and executes the subsequent process steps until such time proper programming of the target memory cell is verified.

The single-level cell (SLC) mode of operation will now be described with reference to FIGS. 28 and 29.

Figure 28:
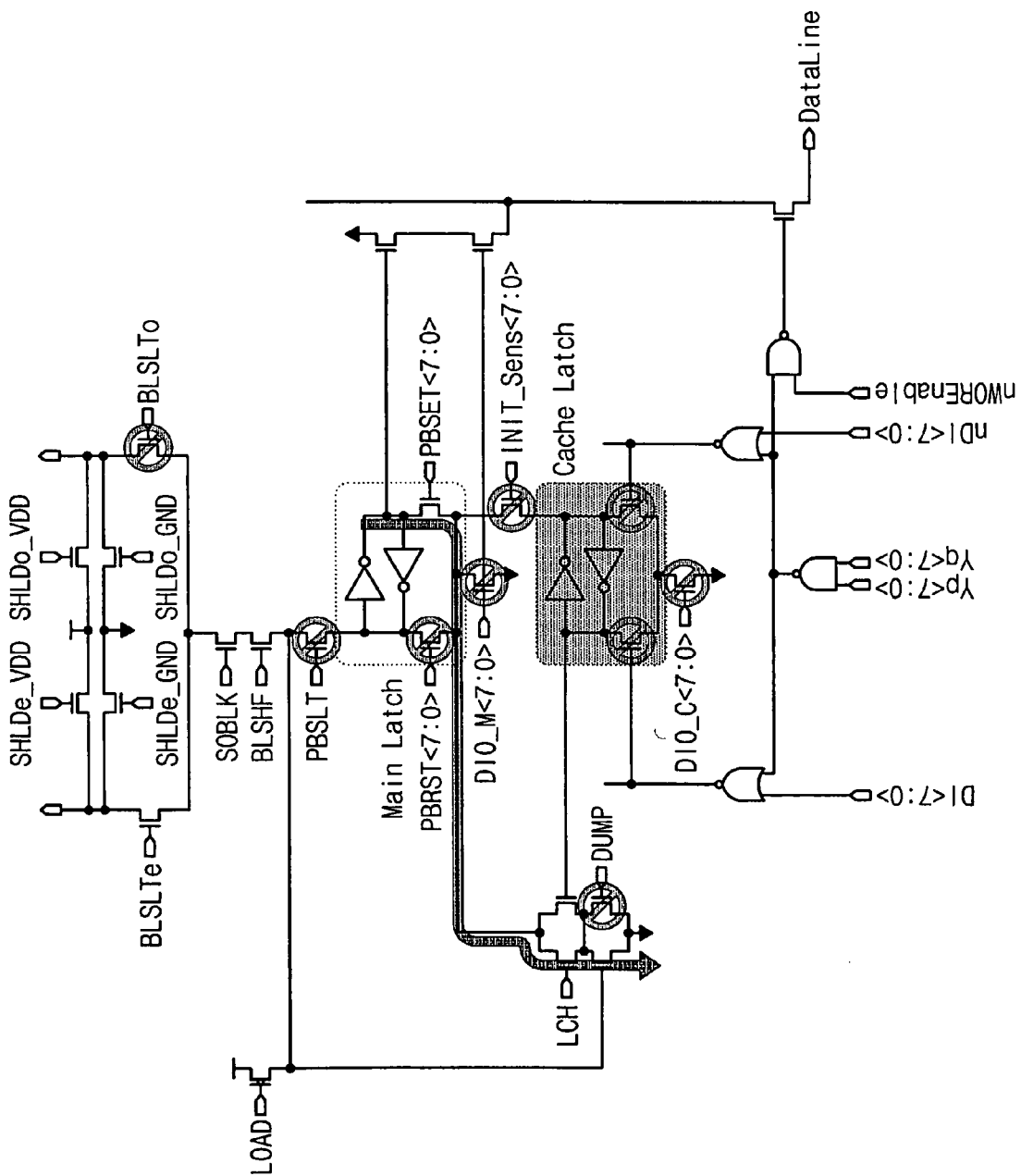
FIGS. 28 and 29 are circuit diagrams for use in explaining read and programming, respectively, in an SLC mode of a multi-bit nonvolatile memory device according to an embodiment of the present invention.

FIG. 28 illustrates the read operation of the SLC operational mode. The read operation of the SLC mode is executed in the same manner as the previously described MSB read operation of the MLC operational mode. As such, a detailed description of the read operation of the SLC mode is omitted here to avoid redundancy.

Figure 29:
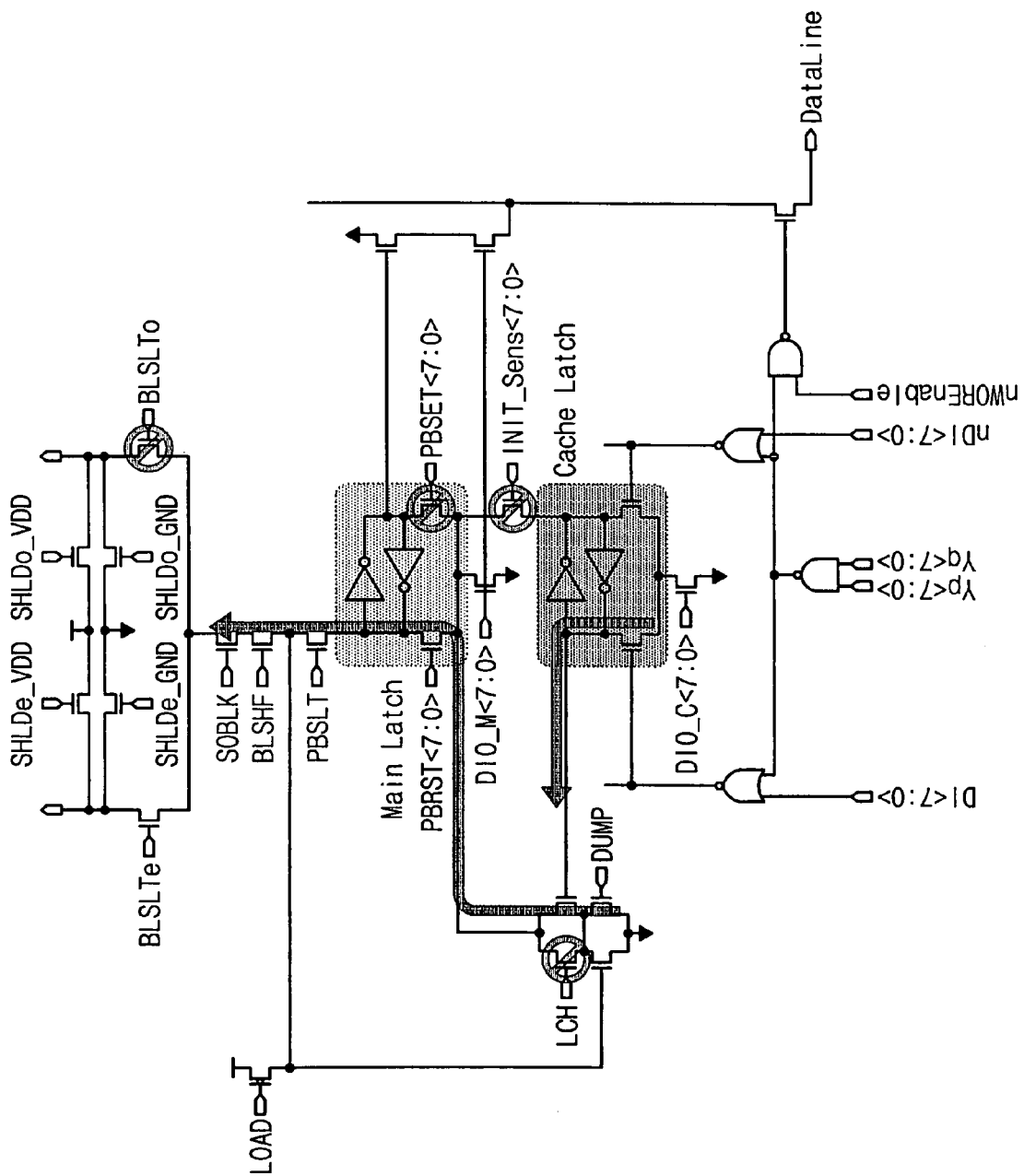

FIG. 29 illustrates the program operation of the SLC operational mode. The SLC program operation is characterized by pre-loading of program data into the cache latch circuit 300. The load path extends through the shared sensing circuit 700 and the main latch circuit 200 as shown in FIG. 29. Pre-loading of the program data into the cache latch circuit 300 increases the operational speed of the SLC program operation.

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. A non-volatile memory device, said memory device comprising a non-volatile memory cell array and a page buffer, wherein said page buffer comprises:
    a sense node selectively connected to a bit line of the memory cell array;
    a main latch circuit including first and second main latch nodes, wherein the first main latch node is selectively connected to the sense node;
    a latch input node selectively connected to the first and second main latch nodes;
    a cache latch circuit including first and second cache latch nodes;
    a switching circuit which selectively connects the second cache latch node to the latch input node; and
a shared sense circuit connected between to the latch input node and a reference potential, wherein the shared sense circuit selectively connects the latch input node to the reference potential in response to a voltage of the sense node and a voltage of the first cache latch node;
    wherein the shared sense circuit comprises: first and second transistors connected in parallel between the main latch input node and an intermediate node; and third and fourth transistors connected in parallel between the intermediate node and the reference potential.

2. The memory device of claim 1, wherein a gate of the second transistor is connected to the first cache latch node, and wherein a gate of the third transistor is connected to the sense node.

3. The memory device of claim 2, wherein a gate of the first transistor is connected to a latch control signal, and wherein a gate of the fourth transistor is connect to a dump control signal.

4. The memory device of claim 3, wherein the memory device is operable in a multilevel cell (MLC) mode which includes a least significant bit (LSB) programming sequence and a most significant bit (MSB) programming sequence, and wherein the MSB programming sequence includes an initial read operation in which (a) the switching device is responsive to an initial sense control signal to connect the second cache latch node to the latch input node, (b) the first transistor is responsive to the latch control signal to turn ON, and (c) the fourth transistor is responsive to the dump control signal to turn OFF.

5. The memory device of claim 4, wherein, in the MLC mode, the nonvolatile memory cells are selectively programmable in any one of at least first, second, third and fourth threshold voltage states, and wherein the first, second, third and fourth threshold voltage states define data values "11", "10", "00" and "01", respectively.

6. The memory device of claim 5, wherein the MSB programming sequence further includes, after the initial read operation, an MSB program execution operation in which a memory cell is programmed, and at least one MSB verification operation in which the threshold voltage of the programmed memory cell is verified.

7. The memory device of claim 6, wherein the at least one MSB verification operation includes a "00" verification operation in which (a) the latch control signal and the dump control signal turn OFF the first and fourth transistors, respectively, and (b) the switching device disconnects the second cache latch node from the latch input node.

8. The memory device of claim 7, wherein the at least one verification operation includes a "01" verification operation in which (a) the latch control signal turns ON the first transistor, (b) the dump control signal turn OFF the fourth transistor, and (c) the switching device disconnects the second latch node of the cache latch from the latch input node.

9. A non-volatile memory device, said memory device comprising a non-volatile memory cell array and a page buffer, wherein said page buffer comprises:
a sense node selectively connected to a bit line of the memory cell array;
a main latch circuit including first and second main latch nodes, wherein the first main latch node is selectively connected to the sense node;
a latch input node selectively connected to the first and second main latch nodes;
a cache latch circuit including first and second cache latch nodes;
a switching circuit which selectively connects the second cache latch node to the latch input node; and
a shared sense circuit connected between to the latch input node and a reference potential, wherein the shared sense circuit selectively connects the latch input node to the reference potential in response to a voltage of the sense node and a voltage of the first cache latch node
wherein the memory device is operable in both a single level cell (SLC) mode and a multilevel cell (MLC) mode.

10. The memory device of claim 9, wherein the SLC mode includes an SLC programming sequence in which programming data is pre-loaded into the cache latch circuit.

11. The memory device of claim 10, wherein the MLC mode includes an MCL programming operation including a least significant bit (LSB) programming sequence followed by a most significant bit (MSB) programming sequence.

12. The memory device of claim 11, wherein MSB programming sequence includes an initial read operation in which the switching device is responsive to a control signal to connect the cache latch circuit to the main latch circuit, and the shared sensing circuit selectively connects the main latch circuit to the reference potential in response to a voltage of the sense node.

13. The method of claim 12, wherein the MSB programming sequence further includes, after the initial read operation, an MSB program execution operation in which a memory cell is programmed, and at least one MSB verification operation in which the threshold voltage of the programmed memory cell is verified.

14. The memory device of claim 9, wherein the non-volatile memory cell array comprises NAND-type flash memory cells.

15. A page buffer of a non-volatile memory device, comprising a main latch circuit, a cache latch circuit and a shared sense circuit which selectively connects main latch circuit to a reference potential in response to voltages of a sense node and the cache latch circuit, wherein the memory device is operable in both a single level cell (SLC) mode and a multilevel cell (MLC) mode.

16. The page buffer of claim 15, wherein the SLC mode includes an SLC programming sequence in which programming data is pre-loaded into the cache latch circuit.

17. The page buffer of claim 15, wherein the MLC mode includes an MCL programming operation including a least significant bit (LSB) programming sequence followed by a most significant bit (MSB) programming sequence.

18. The page buffer of claim 17, wherein MSB programming sequence includes an initial read operation in which the switching device is responsive to a control signal to connect the cache latch circuit to the main latch circuit, and the shared sensing circuit selectively connects the main latch circuit to the reference potential in response to a voltage of the sense node.

19. The page buffer of claim 18, wherein the MSB programming sequence further includes, after the initial read operation, an MSB program execution operation in which a memory cell is programmed, and at least one MSB verification operation in which the threshold voltage of the programmed memory cell is verified.

20. The page buffer of claim 19, wherein, in the MLC mode, the nonvolatile memory cells are selectively programmable in any one of at least first, second, third and fourth threshold voltage states, and wherein the first, second, third and fourth threshold voltage states define data values "11", "10", "00" and "01", respectively.

21. The page buffer of claim 20, wherein the at least one MSB verification operation includes a "00" verification operation in which the switching device is responsive to a control signal to disconnect the cache latch circuit to the main latch circuit, and the shared sensing circuit selectively connects the main latch circuit to the reference potential in response to respective voltages of the sense node and the cache latch circuit.

22. The page buffer of claim 21, wherein the at least one MSB verification operation includes a "01" verification operation in which the switching device disconnects the cache latch circuit from the main latch circuit.

23. The page buffer of claim 15, wherein the non-volatile memory device comprises NAND-type flash memory cells.

24. A method of operating a non-volatile memory device, the memory device including a non-volatile memory cell array and a page buffer, wherein the page buffer includes (a) a sense node selectively connected to a bit line of the memory cell array, (b) a main latch circuit including first and second main latch nodes, wherein the first main latch node is selectively connected to the sense node, (c) a latch input node selectively connected to the first and second latch nodes, (d) a cache latch circuit including first and second cache latch nodes, (e) a switching circuit which selectively connects the second cache latch node to the latch input node, (f) and a shared sensing circuit connected between the latch input node and a reference potential, said method comprising:

executing a multilevel cell (MLC) programming operation which includes a least significant bit (LSB) programming sequence followed by a most significant bit (MSB) programming sequence, wherein MSB programming sequence includes an initial read operation in which (a) the switching device is responsive to an initial sense control signal to connect the second cache latch node to the latch input node, (b) the shared sensing circuit selectively connects the latch input node to the reference potential in response to a voltage of the sense node.

25. The method of claim 24, wherein the MSB programming sequence further includes, after the initial read operation, an MSB program execution operation in which a memory cell is programmed, and at least one MSB verification operation in which the threshold voltage of the programmed memory cell is verified.

26. The method of claim 25, wherein the at least one MSB verification operation includes a "00" verification operation in which (a) the switching device is responsive to the initial sense control signal to disconnect the second cache latch node to the latch input node, (b) the shared sensing circuit selectively connects the latch input node to the reference potential in response to respective voltages of the sense node and the first cache latch node.

27. The method of claim 26, wherein the at least one MSB verification operation includes a "01" verification operation in which the switching device disconnects the second latch node of the cache latch from the latch input node.

28. The method of claim 24, further comprising executing single level cell (SLC) programming and SLC read operations.

29. The method of claim 28, wherein the SLC programming operation including pre-loading of programming data into the cache latch.

30. The method of claim 24, wherein the non-volatile memory device comprises NAND-type flash memory cells.

31. A method of operating a non-volatile memory device, comprising:

using a shared sensing circuit to selectively connect a main latch circuit to a reference potential in response to voltages of a sense node and a cache latch circuit selectively operating the memory device in a single level cell (SLC) mode or a multilevel cell (MLC) mode.

32. The method of claim 31, wherein the SLC mode includes an SLC programming sequence in which programming data is pre-loaded into the cache latch circuit.

33. The method of claim 31, wherein the MLC mode includes an MCL programming operation including a least significant bit (LSB) programming sequence followed by a most significant bit (MSB) programming sequence.

34. The method of claim 33, wherein MSB programming sequence includes an initial read operation in which a switching device is responsive to a control signal to connect the cache latch circuit to the main latch circuit, and the shared sensing circuit selectively connects the main latch circuit to the reference potential in response to a voltage of the sense node.

35. The method of claim 31, wherein the non-volatile memory device comprises NAND-type flash memory cells.

* * * * *